(12) United States Patent
Meyer Timmerman Thijssen et al.

(10) Patent No.: US 11,380,578 B2
(45) Date of Patent: Jul. 5, 2022

(54) FORMATION OF ANGLED GRATINGS

(71) Applicant: Applied Materials, Inc., Santa Clara, CA (US)

(72) Inventors: Rutger Meyer Timmerman Thijssen, San Jose, CA (US); Joseph C. Olson, Beverly, MA (US); Morgan Evans, Manchester, MA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 495 days.

(21) Appl. No.: 16/656,798

(22) Filed: Oct. 18, 2019

(65) Prior Publication Data

US 2020/0144109 A1     May 7, 2020

Related U.S. Application Data

(60) Provisional application No. 62/756,970, filed on Nov. 7, 2018.

(51) Int. Cl.
*H01L 21/768* (2006.01)
*H01L 21/308* (2006.01)
(Continued)

(52) U.S. Cl.
CPC ...... *H01L 21/76816* (2013.01); *H01J 37/304* (2013.01); *H01J 37/3171* (2013.01); *H01L 21/3083* (2013.01); *H01J 2237/24528* (2013.01)

(58) Field of Classification Search
CPC .......... H01L 21/76816; H01L 21/3083; H01L 21/26586; H01L 21/0337; H01L 21/3065; H01L 21/31144; H01L 21/76811; H01L 21/76813; H01L 21/76829; H01J 37/304; H01J 37/3171; H01J 2237/24528; H01J 2237/31749; G02B 5/1819; G02B 27/0172; G02B 5/1857; G02B 6/34
See application file for complete search history.

(56) References Cited

U.S. PATENT DOCUMENTS 4,405,405 A    9/1983  Fujii et al.
5,116,461 A    5/1992  Lebby et al.
(Continued)

FOREIGN PATENT DOCUMENTS

TW    201423286 A    6/2014
WO    2018039271 A1    3/2018
(Continued)

OTHER PUBLICATIONS

Taiwan Office Action dated Feb. 3, 2021 for Application No. 108139609.
(Continued)

*Primary Examiner* — Edward Chin
(74) *Attorney, Agent, or Firm* — Patterson + Sheridan, LLP

(57) ABSTRACT

Systems and methods discussed herein can be used to form gratings at various slant angles across a grating material on a single substrate by determining an ion beam angle and changing the angle of an ion beam among and between ion beam angles to form gratings with varying angles and cross-sectional geometries. The substrate can be rotated around a central axis, and one or more process parameters, such as a duty cycle of the ion beam, can be modulated to form a grating with a depth gradient.

20 Claims, 11 Drawing Sheets

(51) Int. Cl.
 *H01J 37/304* (2006.01)
 *H01J 37/317* (2006.01)

(56) References Cited

U.S. PATENT DOCUMENTS

| | | | |
|---|---|---|---|
| 10,302,826 | B1 | 5/2019 | Meyer Timmerman Thijssen et al. |
| 11,276,563 | B2* | 3/2022 | Kang .................... H01J 37/321 |
| 2010/0321781 | A1 | 12/2010 | Levola et al. |
| 2012/0292535 | A1 | 11/2012 | Choi et al. |
| 2015/0176979 | A1 | 6/2015 | Mathijssen et al. |
| 2015/0227061 | A1 | 8/2015 | Tinnemans et al. |
| 2015/0355554 | A1 | 12/2015 | Mathijssen |
| 2016/0035539 | A1* | 2/2016 | Sainiemi ............. H01J 37/3053 204/298.36 |
| 2017/0003505 | A1 | 1/2017 | Vallius et al. |
| 2018/0011029 | A1 | 1/2018 | Tinnemans et al. |
| 2018/0095201 | A1 | 4/2018 | Meili et al. |
| 2019/0293864 | A1 | 9/2019 | Debnath et al. |
| 2020/0194218 | A1* | 6/2020 | Godet .................. G02B 5/1857 |

FOREIGN PATENT DOCUMENTS

| | | |
|---|---|---|
| WO | 2018065776 A1 | 4/2018 |
| WO | 2019231576 A1 | 12/2019 |

OTHER PUBLICATIONS

International Search Report and Written Opinion, PCT/US2019/027828, dated Aug. 2, 2019.
International Search Report and Written Opinion dated Mar. 25, 2020 for Application No. PCT/US2019/056878.
Taiwan Office Action dated Sep. 16, 2020 for Application No. 108139609.

* cited by examiner

FORMATION OF ANGLED GRATINGS

CROSS-REFERENCE TO RELATED APPLICATIONS

This application claims benefit to U.S. Appl. No. 62/756,970, filed on Nov. 7, 2018, which is herein incorporated by reference.

BACKGROUND

Field

Embodiments of the present disclosure generally relate to angled etch tools. More specifically, embodiments described herein provide for utilizing angled etch tools to form gratings with different slant angles, depth gradients, and wedge angles.

Description of the Related Art

Augmented reality creates an experience for a user that can be viewed through display lenses of augmented reality glasses or using other HMD devices to view the surrounding environment. Augmented reality devices allow users to see images of virtual objects that are generated for display and appear as part of the environment. Augmented reality can include audio and haptic inputs, as well as virtual images, graphics, and video that enhances or augments the user's environment.

One challenge in augmented reality device design and fabrication is the display of a virtual image that is overlaid on an ambient environment. Augmented waveguide combiners are used to assist in overlaying images. Generated light is first in-coupled into an augmented waveguide combiner and propagated through the augmented waveguide combiner. The generated light is then out-coupled from the augmented waveguide combiner and overlaid on the ambient environment. Light is coupled into and out of augmented waveguide combiners using surface relief gratings. The intensity of the out-coupled light may not be adequately controlled using conventional designs.

Another challenge is that a waveguide combiner may use gratings with different slant angles depending on the properties desired of the augmented reality device. Additionally, a waveguide combiner may include gratings with different slant angles to adequately control the in-coupling and out-coupling of light, and the slant angles may be at angles different than the grating vector.

Accordingly, what is needed is improved augmented waveguides combiners and methods of fabrication of gratings and grating masters.

SUMMARY

In one or more embodiments, a method of forming a grating includes etching a hardmask layer to form a plurality of openings, the hardmask layer being disposed over a grating material layer that is disposed on a substrate and forming a first grating in the grating material layer through the plurality of openings of the hardmask layer, wherein the first grating has a first shape vector and a first grating vector. The first grating can be formed by determining a first ion beam angle $\vartheta_1$ relative to a first slant angle $\vartheta_1'$ and an angle $\varphi_1$ which is between the first shape vector and the first grating vector and positioning a first portion of the grating material layer in a path of an ion beam at the first ion beam angle $\vartheta_1$ relative to the substrate, the substrate being retained on a platen. The method also includes modulating one or more process parameters when the ion beam is at the first ion beam angle $\vartheta_1$ to form a first plurality of fins of the first grating having the first shape vector, the first grating vector, and the first slant angle $\vartheta_1'$ relative to a surface normal of the substrate such that the first plurality of fins are formed at the first slant angle $\vartheta_1'$. In some examples, the first grating is further formed by rotating the substrate about a central axis of the platen to a first rotation angle between the ion beam and the first grating vector of the first grating.

In some embodiments, a method of forming a grating, including: etching a first grating material layer to form a first feature in the first grating material layer disposed on a substrate, depositing an etch stop layer in the first feature, depositing a second grating material layer on the etch stop layer, and depositing a hardmask layer on the second grating material layer. The method further includes etching the hardmask layer to form a plurality of openings and forming a first grating in the second grating material layer through the plurality of openings, wherein the first grating has a first shape vector and a first grating vector. The first grating can be formed by determining a first ion beam angle $\vartheta_1$ relative to a first slant angle $\vartheta_1'$ and an angle $\varphi_1$ which is between the first shape vector and the first grating vector, and by positioning a first portion of the substrate relative to an ion beam at the first ion beam angle $\vartheta_1$, the substrate being retained on a platen and the first ion beam angle $\vartheta_1$ being measured relative to a plane parallel to the platen. The method also includes modulating one or more process parameters when the ion beam is at the first ion beam angle $\vartheta_1$ and in contact with the first portion of the substrate. In some examples, the process parameter can be or include a duty cycle of the ion beam, a partial scan of the ion beam, a scan speed of the ion beam, a power source for generating the ion beam, or any combination thereof.

In other embodiments, a method of forming a grating, including: etching, a plurality of openings in a hardmask layer, the hardmask layer being disposed on a grating material layer and the grating material layer being disposed on a substrate and etching, through the plurality of openings in the hardmask layer, the substrate, to form a first grating in the grating material layer, the first grating comprising a plurality of fins formed in a recess, wherein the first grating is has a first shape vector and a first grating vector. The first grating can be formed by determining a first ion beam angle $\vartheta_1$ relative to a first slant angle $\vartheta_1'$ and an angle $\varphi_1$ which is between the first shape vector and the first grating vector and positioning a first portion of the grating material layer relative to an ion beam at the first ion beam angle $\vartheta_1$, the ion beam being adjustable within an angle of about 15° to about 75° relative to a plane parallel to the substrate, the substrate being retained on a platen. The method further includes rotating the substrate about a central axis of the platen to a first rotation angle between the ion beam and the first grating vector of the first grating when the ion beam is at the first ion beam angle $\vartheta_1$, and etching the first grating at a first angle to remove a top portion of the plurality of fins to form a wedge, where the first shape vector is a wedge vector.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Virtual and augmented reality devices that employ gratings can utilize depth-modulated slanted gratings, where the direction in which the grating(s) of a wedge is formed may not be aligned to the grating vector. The depth-modulated slanted gratings are etched in target materials using an ion beam that can accommodate a range of angles to form gratings of different slant angles and with differing depth gradients. The modulation of grating depth increases optical uniformity in optical devices such as waveguide combiners.

Using the systems and methods discussed herein, gratings are formed with depth gradients that are not aligned with the grating vector by rotating the substrate and by modulating a process parameter (e.g., a duty cycle of the ion beam), creating smooth gradient depth profiles at various orientations relative to the substrate. The systems and methods discussed herein can be employed to form waveguide combiners or other optical elements, and can be further employed to form masters for imprinting waveguide combiners or other optical elements. The gratings formed as discussed herein can be formed as wedges or to exhibit other cross-sectional shapes.

A grating as discussed herein is a pattern formed in a target material layer that is made up of a plurality of fins separated by a plurality of troughs. The plurality of fins can be formed to a plurality of depths and heights and are formed by etching the target material using an angled, adjustable ion beam and by rotating the substrate. The plurality of fins are formed at a slant angle relative to a substrate plane. The grating can be formed to have a cross-sectional geometry of a wedge, rectangle, or other polygonal or rounded shape or combinations of shapes. Gratings can be formed and subsequently modified in height and/or critical dimensions. Critical dimensions as discussed herein can refer to the fin height, pitch, width, or other dimensions of a grating depending upon the embodiment.

A grating vector is measured normal to the grating lines and aligned with the slant angle of the fins. A wedge direction (vector) can be measured by the change in depth of the gratings of the wedge, for example, the direction in which the depth of the find of a wedge-shaped grating increase. In one or more examples, the wedge vector is the same as a scanning direction of an apparatus in which the substrate is disposed for formation of the grating(s). An angle formed between a wedge vector and a grating vector can be used in combination with the slant angle of the fins to determine an ion beam angle to use to form a grating.

Figure 1:
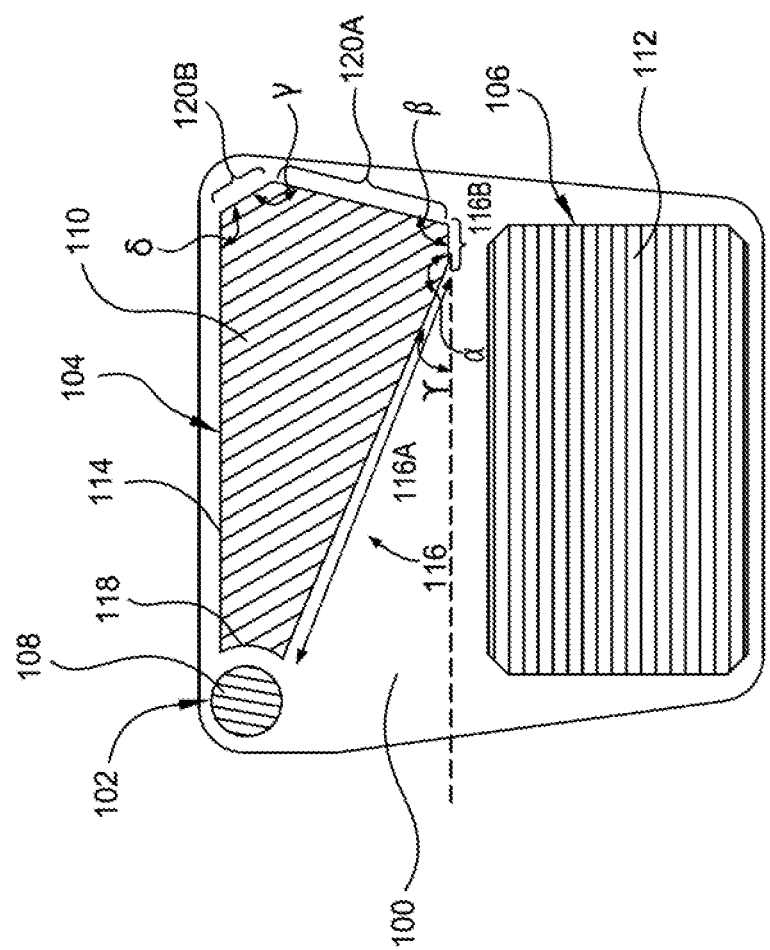
FIG. 1 depicts a perspective, frontal view of an augmented waveguide combiner, according to one or more embodiments described and discussed herein.

FIG. 1 depicts a perspective, frontal view of an augmented waveguide combiner 100, according to one or more embodiments. It is to be understood that the augmented waveguide combiner 100 described below is an exemplary augmented waveguide combiner and other augmented waveguide combiners may be used with or modified to accomplish aspects of the present disclosure. The augmented waveguide combiner 100 includes an input coupling region 102 defined by a first plurality of gratings 108, an intermediate region 104 defined by a second plurality of gratings 110, and an output coupling region 106 defined by a third plurality of gratings 112. The input coupling region 102 receives incident beams of light having an intensity from a microdisplay. Each grating of the plurality of gratings 108 splits the incident beams into a plurality of modes, each incident beam having a mode.

Different beam modes react differently to the augmented waveguide combiner 100. For example, zero-order mode (T0) beams are refracted back or lost in the augmented waveguide combiner 100. In contrast to T0 beams, positive first-order mode (T1) beams are coupled though the augmented waveguide combiner 100 to the intermediate region 104, and negative first-order mode (T-1) beams propagate in the augmented waveguide combiner 100 in a direction opposite to the T1 beams. Ideally, the incident beams are split into T1 beams that have all of the intensity of the incident beams in order to direct the virtual image to the intermediate region 104. In one or more embodiments, each grating of the plurality of gratings 108 is angled to suppress the T-1 beams and the T0 beams. The T1 beams undergo total-internal-reflection (TIR) through the augmented waveguide combiner 100 until the T1 beams come in contact with the second plurality of gratings 110 in the intermediate region 104.

When the T1 beams contact a grating of the second plurality of gratings 110, the T1 beams are split into T0 beams, T1 beams, and T-1 beams. The T0 beams are refracted back or lost in the augmented waveguide combiner 100, the T1 beams undergo TIR in the intermediate region 104 until the T1 beams contact another grating of the second plurality of gratings 110, and the T-1 beams are coupled through the augmented waveguide combiner 100 to the output coupling region 106. The T1 beams that undergo TIR in the intermediate region 104 continue to contact the second plurality of gratings 110 until one of (1) the intensity of the T1 beams coupled through the augmented waveguide combiner 100 to the intermediate region 104 is depleted, or (2) the remaining T1 beams propagating through the intermediate region 104 reach the end of the intermediate region 104. The second plurality of gratings 110 is tuned to control the T1 beams that are coupled through the augmented waveguide combiner 100 to the intermediate region 104. Tuning the second plurality of gratings 110 controls the intensity of the T-1 beams coupled to the output coupling region 106 to modulate a field of view of the virtual image produced from the microdisplay from a user's perspective and increase a viewing angle from which a user can view the virtual image.

In one or more embodiments, the second plurality of gratings 110 can be referred to herein as a wedge, and is defined by a slant angle (discussed below) of fins that form the wedge, a first side 114, and an angled second side 116 opposite the first side 114. The angled side 116 includes a first portion 116A and a second portion 116B. The second plurality of gratings 110 is further defined by a curved first end 118, an angled second end that is defined by a first portion 120A and a second portion 120B. The curved first end 118 can take on various curvatures depending upon the embodiment. A first angle α is defined by the first portion 116A of the angled side 116 and the second portion 116B of the angled side 116. A second angle β is defined by the second portion 116B and the first portion 120A of the angled second end. A third angle γ can be defined by the first portion 120A and the second portion 120B of the angled second end. A fourth angle δ can be defined by the first side 114 and the second portion 120B of the angled second end. The systems and methods discussed herein form wedges or other shapes where each fin of the second plurality of gratings 110 has a first end and a second end, the first end being located along the angled second side 116 and the second end of the fins being located along the first side 114. Each fin of the second plurality of gratings 110 can be further defined by various geometric features. For example, the first side of the fin can have a ramp (angle) such that the fins along the angled second side 116 each have a ramp. The second side of each fin can have an undercut such that the fins along the first side 114 each have an undercut.

Further in FIG. 1, a depth gradient is defined in a direction from a first side 110A of the plurality of gratings 110 to a second side 110B. FIG. 1 also illustrates depth gradients for at least the second plurality of gratings 110 and the third plurality of gratings 112. Each depth gradient can be further defined by a depth gradient in a direction of an increase or decrease in the depth of the fins of a grating or of a plurality of gratings. The depth gradients are shown via shading in FIG. 1, the depth gradient increases from the first side 110A to the second side 110B for the second grating 110 and increases from a top 112A of the third plurality of gratings 112 to a bottom 112B. A grating vector (not shown here) of the second plurality of gratings 110 is measured orthogonally to the second plurality of gratings 110. A wedge angle of the second plurality of gratings 110 can be defined as the angle between the grating vector and the depth gradient. Similarly, a grating vector (not shown here) of the third plurality of gratings 112 is measured orthogonally to the third plurality of gratings 112.

The T-1 beams coupled through the augmented waveguide combiner 100 to the output coupling region 106 undergo TIR in the augmented waveguide combiner 100. The T-1 beams undergo the TIR until the T-1 beams contact a grating of the plurality of gratings 112 where the T-1 beams are split into (a) T0 beams refracted back or lost in the augmented waveguide combiner 100, (b) T1 beams that undergo TIR in the output coupling region 106 until the T1 beams contact another grating of the plurality of gratings 112, and (c) T-1 beams coupled out of the augmented waveguide combiner 100. The T1 beams that undergo TIR in the output coupling region 106 continue to contact gratings of the plurality of gratings 112 until the either the intensity of the T-1 beams coupled through the augmented waveguide combiner 100 to the output coupling region 106 is depleted, or remaining T1 beams propagating through the output coupling region 106 have reached the end of the output coupling region 106. The plurality of gratings 112 must be tuned to control the T-1 beams coupled through the augmented waveguide combiner 100 to the output coupling region 106 in order to control the intensity of the T-1 beams coupled out of the augmented waveguide combiner 100 to further modulate the field of view of the virtual image produced from the microdisplay from the user's perspective and further increase the viewing angle from which the user can view the virtual image.

Figure 2A:
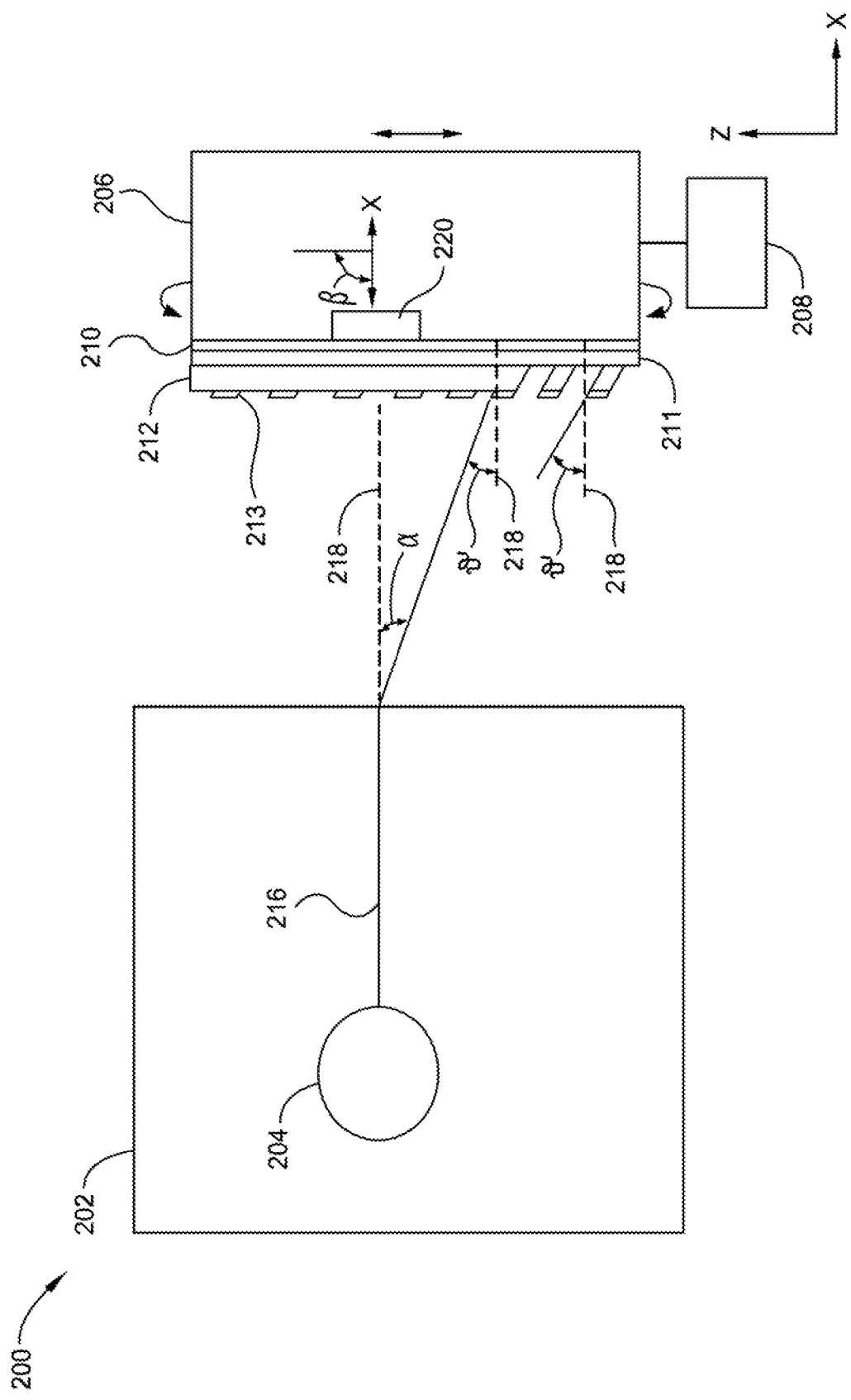
FIG. 2A depicts a side, schematic cross-sectional view of an angled etch system, according to one or more embodiments described and discussed herein.
Figure 2B:
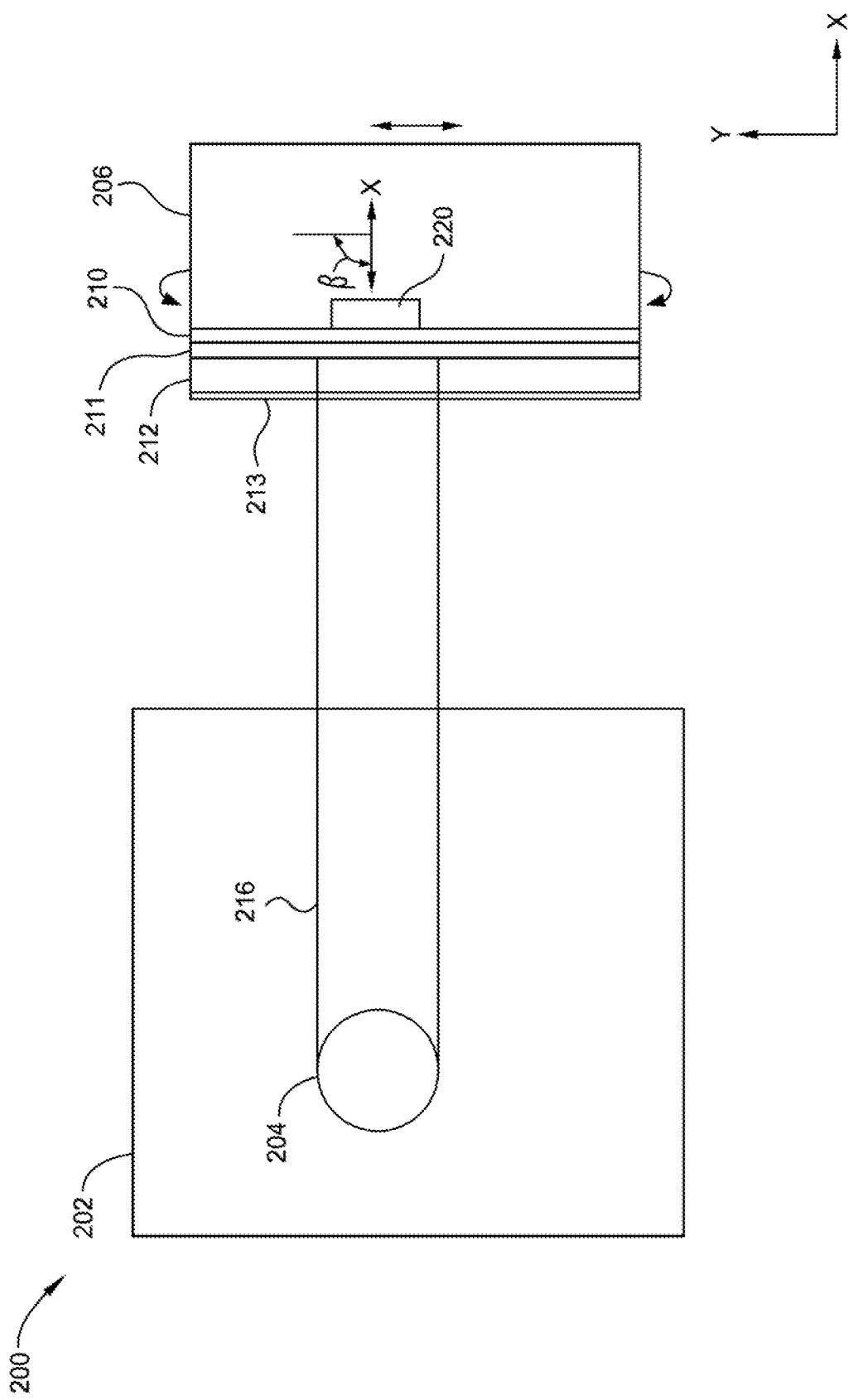
FIG. 2B depicts side, schematic cross-sectional view of an angled etch system, according to one or more embodiments described and discussed herein.

FIG. 2A depicts a side, schematic cross-sectional view and FIG. 2B depicts side, schematic cross-sectional view of an angled etch system 200, according to one or more embodiments. To form gratings having slant angles, a grating material 212 disposed on a substrate 210 is etched by the angled etch system 200. In one or more embodiments, the grating material 212 is disposed on an etch stop layer 211 disposed on the substrate 210 and a patterned hardmask 213 is disposed over the grating material 212. In one or more embodiments, the materials of grating material 212 are selected based on the slant angle θ' of each grating and the refractive index of the substrate 210 to control the in-coupling and out-coupling of light and facilitate light propagation through a waveguide combiner. In some embodiments, the grating material 212 includes silicon oxycarbide (SiOC), titanium dioxide ($TiO_2$), silicon oxide (e.g., silicon dioxide ($SiO_2$)), vanadium (IV) oxide ($VO_2$), aluminum oxide ($Al_2O_3$), indium tin oxide (ITO), zinc oxide (ZnO), tantalum pentoxide ($Ta_2O_5$), silicon nitride (SiN or $Si_3N_4$), titanium nitride (TiN), and/or zirconium dioxide ($ZrO_2$) containing materials. The grating material 212 has a refractive index between about 1.5 and about 2.65. In yet another embodiment, the patterned hardmask 213 is a non-transparent hardmask that is removed after the waveguide combiner is formed. For example, the non-transparent hardmask includes reflective materials, such as chromium or silver.

In some embodiments, the patterned hardmask 213 is a transparent hardmask. In one or more embodiments, the etch stop layer 211 is a non-transparent etch stop layer that is removed after the waveguide combiner is formed. In some embodiments, the etch stop layer 211 is a transparent etch stop layer. The angled etch system 200 is configured to execute a plurality of instructions, for example, using a controller (not shown), in order to form the angled gratings discussed herein. The plurality of instructions executed can include a slant angle, an ion beam angle, a change in ion beam angle in between formation of gratings, a wedge angle, a depth gradient, and/or other aspects of a wedge to be formed from the grating(s).

The angled etch system 200 includes an ion beam chamber 202 that houses an ion beam source 204. The ion beam source is configured to generate an ion beam 216, such as a ribbon beam, a spot beam, or full substrate-size beam. The ion beam chamber 202 is configured to direct the ion beam 216 at an angle α relative to a surface normal 218 of substrate 210. The substrate 210 is retained on a platen 206 coupled to a first actuator 208. The first actuator 208 is configured to move the platen 206 in a scanning motion along a y-direction and/or a z-direction. To form gratings having a slant angle $\vartheta'$ relative the surface normal 218, the ion beam source 204 generates an ion beam 216 and the ion beam chamber 202 directs the ion beam 216 towards the substrate 210 at the angle α. The first actuator 208 positions the platen 206 so that the ion beam 216 contacts the grating material 212 at the ion beam angle $\vartheta$ and etches gratings having a slant angle $\vartheta'$ on desired portions of the grating material 212. One or more process parameters (e.g., a duty cycle of the ion beam 216) can be modulated to form fins of a grating to varying depths.

Figure 3:
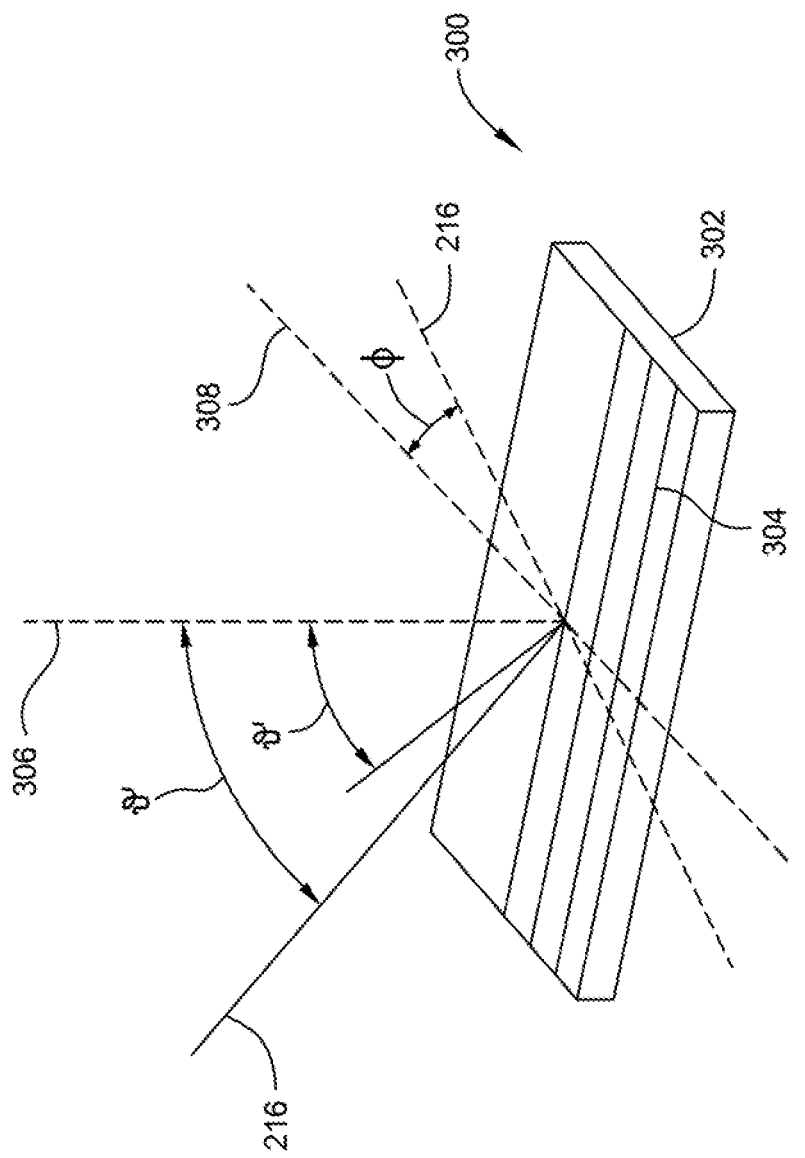
FIG. 3 depicts a schematic perspective view of a portion of a substrate with angled gratings, according to one or more embodiments described and discussed herein.

FIG. 3 depicts a schematic perspective view of a portion 300 of a substrate 302, according to one or more embodiments. The ion beam angle $\vartheta$ is between about 0° and about 90°. The ion beam angle $\vartheta$ is adjustable during grating fabrication preferably between about 15° and about 75° as a ion beam angle $\vartheta$ close to about 0° or about 90° will result in gratings 304 having a slant angle $\vartheta'$ of about 0° or about 90° such that the gratings 304 are not slanted. Thus, the slant angle $\vartheta'$ can be determined by the relative orientation between the ion beam angle and the rotational position of the substrate. The substrate 302 is rotated about the x-axis of the platen 206 resulting in rotation angle φ between the ion beam 216 and a grating vector 308 of the gratings 304 is measured orthogonally to the gratings 304. To form wedges as discussed herein, the duty cycle of the ion beam and/or other process parameters can be modulated to change the etch depth.

In one or more examples, the process parameter can be or include a duty cycle of the ion beam, a partial scan of the ion beam, a scan speed of the ion beam, a power source (e.g., voltage) for generating the ion beam, or any combination thereof. In some examples, the duty cycle is modulated from about 5% to about 85%, where the 5% duty cycle forms shallow fins of a grating and the 85% duty cycle forms fins of the grating to a deeper depth. In other examples, the partial scan of the ion beam, the scan speed of the ion beam, and/or the power source for generating the ion beam can independently be modulated to form various depths (e.g., from relatively shallow to relatively deep) of grating fins. While the formation of gratings with wedge-shaped cross-sections is discussed herein, in other examples, different gratings can be formed with varying depth gradients and slant angles to form gratings with curved, bowed, angled, flat, or other cross-sectional profiles that are combinations of various geometries.

In one or more embodiments, the ion beam angle $\vartheta$ is aligned with the depth gradient of a grating. A depth gradient, discussed above, is a measurement of an amount of change in depth in the fins across a grating, and a depth gradient is the direction in which the depth of the fins changes. The ion beam angle $\vartheta$ can be determined by rotation from a grating angle using equation $\vartheta=\operatorname{atan}(\tan(\vartheta')/\cos(\varphi))$, to determine the slant angle of the fins where $\vartheta$=ion beam angle, $\vartheta'$=slant angle of the fin, φ=angle between a shape vector of the grating, for example, a wedge vector, and a grating vector. A shape vector is a direction in which the depth gradient of a grating changes, for example, a direction in which the depth of the fins increases. The depth gradient is the change in depth of fins across a grating. In one or more examples, for a 22.5° slant grating, with the wedge offset 45° from the grating vector, $\vartheta=\operatorname{atan}(\tan(22.5°/\cos(45°))\approx30.3°$.

Figure 4:
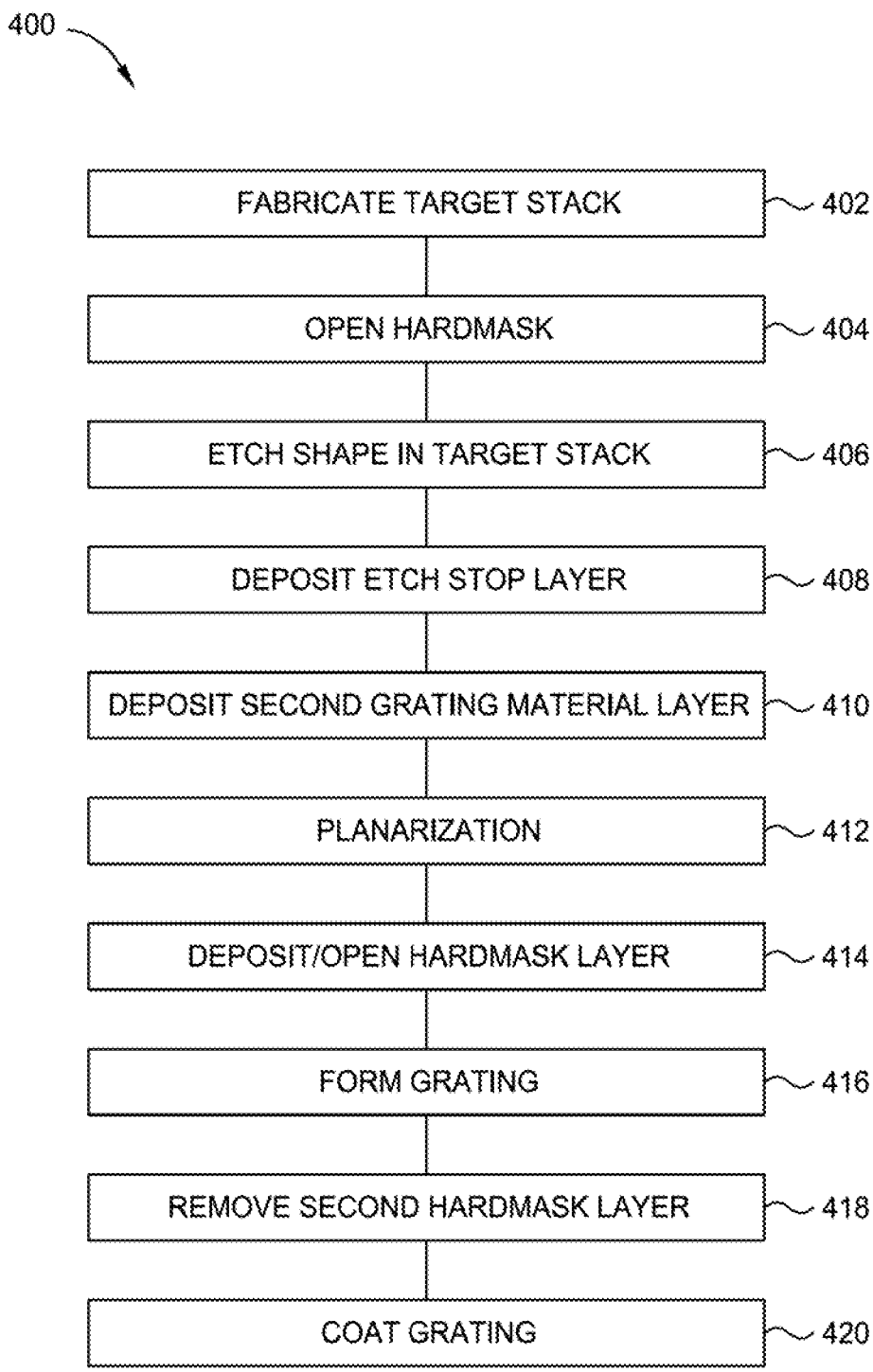
FIG. 4 is a flowchart illustrating a method for forming a grating, according to one or more embodiments described and discussed herein.
Figure 5A:
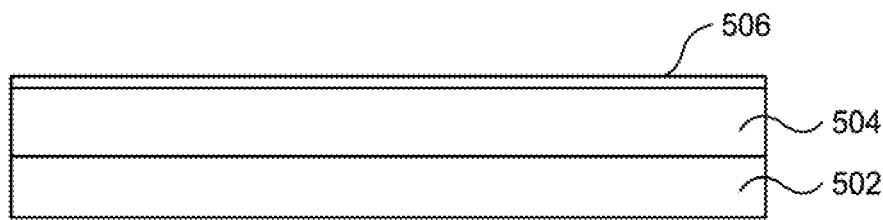
FIGS. 5A-5J illustrate structures at different of intervals while being produced during the method depicted in FIG. 4, according to one or more embodiments described and discussed herein.

FIG. 4 is a flowchart illustrating a method 400 of forming a grating, according to one or more embodiments. FIGS. 5A-5J illustrate structures at different of intervals while being produced during the method 400. In the method 400, at operation 402, a target stack is fabricated in a plurality of sub-operations that can include chemical vapor deposition (CVD). The target stack formed at operation 402 is shown in FIG. 5A, and includes a substrate 502 and a grating material layer 504 formed over the substrate 502. The target stack further includes a hardmask layer 506 formed over the grating material layer 504. The substrate 502 can be formed from a silicon-based material such as $SiO_2$, and the hardmask layer 506 can be formed from a metallic material such as chromium or titanium, or from a dielectric material such as silicon carbonitride (SiCN). The grating material layer 504 can include silicon oxycarbide (SiOC), titanium dioxide ($TiO_2$), silicon dioxide ($SiO_2$), vanadium oxide ($VO_2$), aluminum oxide ($Al_2O_3$), indium tin oxide (ITO), zinc oxide (ZnO), tantalum pentoxide ($Ta_2O_5$), silicon nitride ($Si_3N_4$), titanium nitride (TiN), or zirconium dioxide ($ZrO_2$). The stack shown in FIG. 5A can be fabricated using various sub-operations including CVD. In one or more examples, the grating material layer 504 is from 150 nm to 350 nm thick, the hardmask layer 506 is from about 15 nm to about 70 nm thick.

Figure 5B:
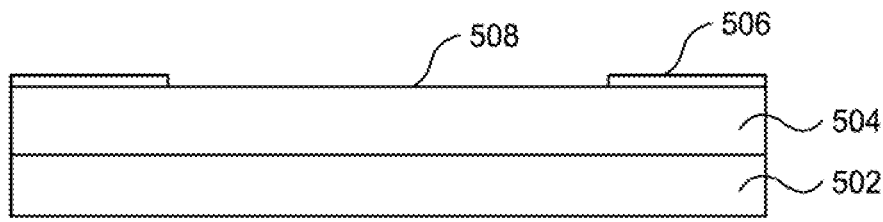
Figure 5C:
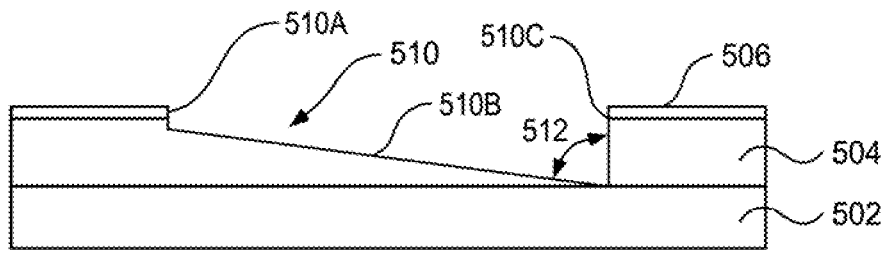

At operation 404, a contiguous portion of the hardmask layer 506 is removed to form an opening 508 in the hardmask layer 506. Operation 404 can be performed using one or more chemicals in a wet strip etch operation to form the opening 508. FIG. 5B shows a structure resulting from the removal of the portion of the hardmask layer 506 at operation 404. At operation 406, a portion of the grating material layer 504 is etched or otherwise removed to form a feature 510. FIG. 5C shows a structure resulting from the formation of the feature 510 at operation 406. Operation 406 can be executed using selective area processing (SAP) etch to remove one or more portions of the grating material layer 504. During operation 406, the SAP etch can be used to form a feature 510 that can contain various cross-sections, including but not limited to the wedge-like cross section of the feature 510 shown in FIG. 5C. For example, while the feature 510 is shown in FIG. 5C as a wedge or triangular shape, in other examples, various polygonal or combination shapes can be formed at operation 406 using SAP etch. The feature 510 can be referred to as a recess and is defined by a first side 510A, a transitional surface 510B, and a second side 510C. The second side 510C is opposite the first side 510A, and the transitional surface 510B extends between the first side 510A and the second side 510C. The transitional surface 510B is formed at an angle 512 relative to the substrate 502. In the example in FIG. 5C, the second side 510C is formed to a greater depth than the first side 510A.

In one or more embodiments, the SAP can include a designed number of exposure cycles, where a given exposure cycle entails scanning the processing beam along a particular direction and a subsequent rotation of the substrate 504 to a new rotational position. In some examples, an SAP etch can include 2 exposure cycles, 4 exposure cycles, 6 exposure cycles, 8 exposure cycles, or more. In some examples, an SAP etch can include different exposure cycles where the substrate 504 is positioned at different rotational positions, such that each cycle is performed at a different rotational position. Additional aspects of the SAP etch are described and discussed in U.S. Pat. No. 10,269,663 (column 4, line 34 to column 7, line 61), and in U.S. Pat. No. 10,302,826, which are incorporated herein by reference.

Figure 5D:
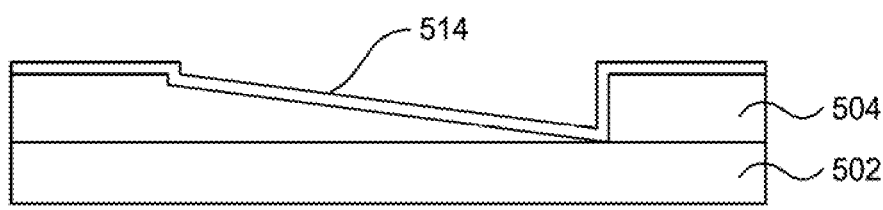

At operation 408, an etch stop layer 514 is deposited on the feature 510. FIG. 5D shows a structure resulting from the deposition of the etch stop layer 514 at operation 408. The etch stop layer 514 can be deposited at operation 408 via a CVD process, an atomic layer deposition (ALD), or another process that forms a conformal coating on the feature 510. The etch stop layer 514 can be formed to a thickness from 15 nm to 50 nm thick. In one or more examples, the etch stop layer 514 is formed at operation 408 from a nitride such as tantalum nitride. In another example, the etch stop layer 514 is formed at operation 408 from a silicon-based material such as silicon oxide.

Figure 5E:
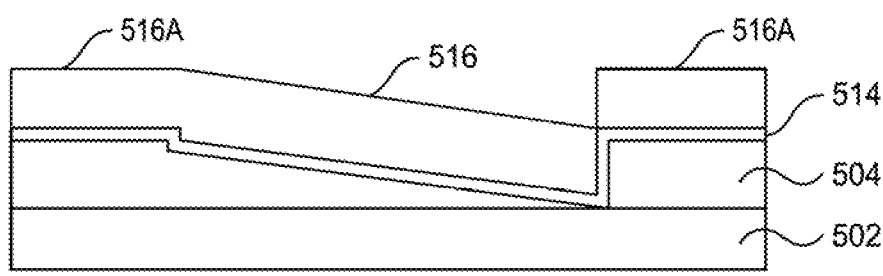

At operation 410 a second grating material layer 516 is deposited on the etch stop layer 514. The second grating material layer 516 can be deposited using CVD and is formed inside of the feature 510 as well as on either side of the feature 510, resulting in excess of material 516A. FIG. 5E shows a structure resulting from the deposition of the second grating material layer 516 at operation 410. In one or more embodiments, each of the grating material layer 504 and the second grating material layer 516 is formed from at least one of silicon oxycarbide (SiOC), titanium oxide (e.g., titanium dioxide ($TiO_2$)), silicon oxide (e.g., silicon dioxide ($SiO_2$)), vanadium (IV) oxide ($VO_2$), aluminum oxide ($Al_2O_3$), indium tin oxide (ITO), zinc oxide (ZnO), tantalum pentoxide ($Ta_2O_5$), silicon nitride (SiN or $Si_3N_4$), titanium nitride (TiN), zirconium dioxide ($ZrO_2$), oxynitrides thereof, or any combination thereof. The hardmask layer 506 is formed from silicon nitride, silicon oxide, a metal-based layer containing titanium or chromium, dopants thereof, alloys thereof, or any combination thereof.

Figure 5F:
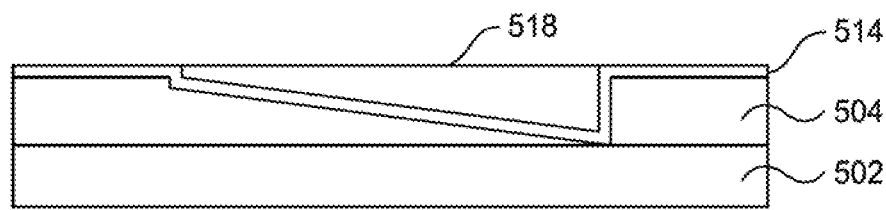
Figure 5G:
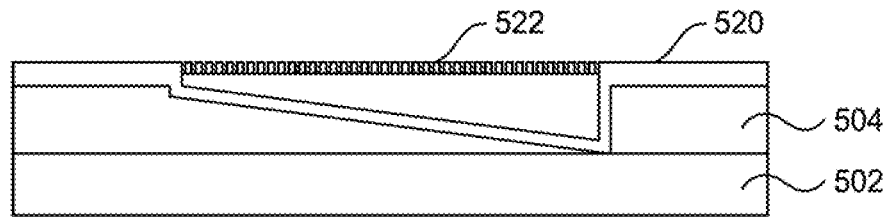

Subsequently, at operation 412, the excess material from the second grating material layer 516 is removed (planarized) to form a planarized surface 518. The planarization at operation 412 can be performed using SAP etch. FIG. 5F shows a structure resulting from the planarization at operation 412. At operation 414, a second hardmask layer 520 is deposited on the second grating material layer 516 and etched to form a plurality of openings 522. FIG. 5G shows a structure resulting from the deposition of the second hardmask layer 520 at operation 414. The second hardmask layer 520 can be deposited at operation 414 using CVD and etched using deep ultraviolet (DUV) lithography to form the plurality of openings 522 (e.g., by using DUV to form a pattern that is transferred to the hardmask layer 520 via an etching process). In other examples, the second hardmask layer 520 can be patterned using nanoimprint lithography (NIL) to form the plurality of openings 522. In one or more examples at operation 414, the plurality of openings 522 can be formed in a plurality of sub operations including depositing a photoresist (not shown) on the second hardmask layer 520, performing DUV lithography to pattern the photoresist, and etching the second hardmask layer 520 through the patterned photoresist. The photoresist can then be removed prior to operation 416. The second hardmask layer 520 can be formed from materials similar to those used to form the hardmask layer 506 as discussed above. In one or more examples, the second hardmask layer 520 is formed from a material that is different than that of the etch stop layer 514 such that the two materials have differing etch selectivity.

Figure 5H:
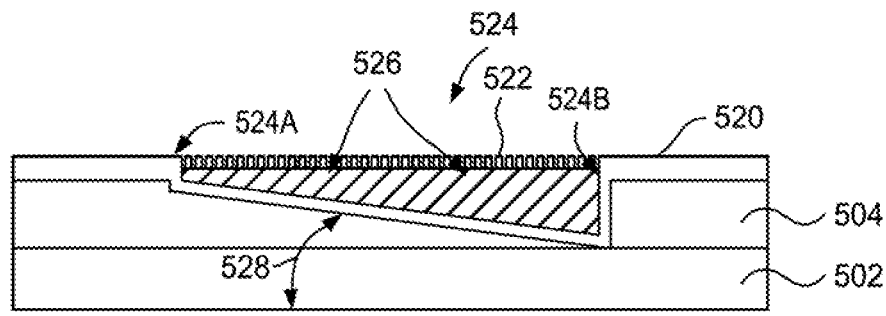
Figure 5:
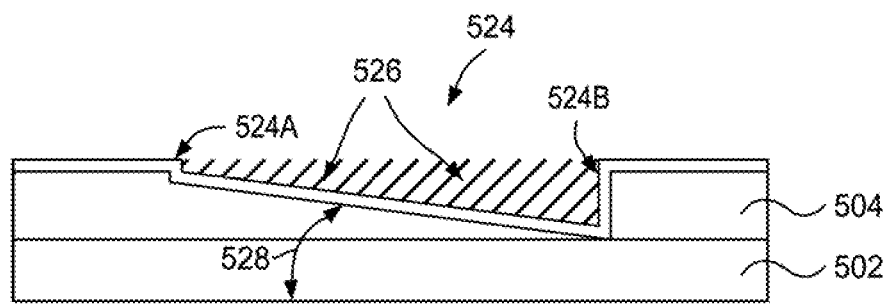

At operation 416, a first grating 524 including a first plurality of fins 526 is formed in the second grating material layer 516 through the plurality of openings 522 in the second hardmask layer 520. FIG. 5H shows a structure resulting from the formation of the first grating 524 at operation 416. Operation 416 can be executed using the angled etch system discussed above in FIGS. 2A and 2B to form the first plurality of fins 526 at a first slant angle. During operation 416, to form the first grating 524, a first portion of the substrate 502 is positioned relative to an ion beam at a first ion beam angle. Operation 416 includes determining the first ion beam angle $\vartheta_1$ for the first grating 524. As discussed above, the first ion beam angle $\vartheta_1$ can be determined by the rotation from a grating angle of the first grating using equation $\vartheta_1 = a\tan(\tan(\vartheta_1')/\cos(\varphi_1))$.

The substrate 502 is retained on a platen and the first ion beam angle is measured, as discussed above, relative to a plane parallel to the platen. The substrate 502 is rotated about a central axis of the platen to a first rotation angle between the ion beam and a first grating vector of the first grating 524 when the ion beam is at the first ion beam angle. The ion beam is a ribbon beam with an angle adjustable from about 15 degrees to about 75 degrees with respect to the plane parallel to the platen. The first grating 524 has the first plurality of fins 526 formed such that the fin adjacent to a first end 524A of the first grating 524 is formed to a lesser depth than the fin adjacent to the second end 524B of the first grating. In one or more examples, a depth of the first grating is from about 10 nm to about 400 nm and a width of each fin of the plurality of fins 526 is from about 30% to about 70% of the pitch of the plurality of fins 526. The plurality of fins 526 are formed at a first slant angle as discussed above, the first slant angle can be from about 0 degrees to about 60 degrees. The plurality of fins 526 can be associated with a first depth gradient such that the height from the first side 524A to the second side 524B of the grating 524 increases, thus increasing the depth of the etching. The variation in height of the fins 526 along a bottom surface 524C can create the wedge angle 528. The ion beam has one or more process parameters (e.g., a duty cycle) which can be modulated to form the first grating 524. For example, the process parameter when the ion beam is at the first ion beam angle and in contact with the first portion of the substrate can be modulated from about 5% to about 85% of the duty cycle. A shorter modulation time for the process parameter (e.g., 5%) can be used to form fins with a lesser depth, such as those at or near the first end 524A of the first grating 524. Similarly, a longer modulation time for the process parameter (e.g., 85%) can be used to form fins with a greater comparative depth, such as those at or near the second end 524B of the first grating. In one or more embodiments, the first ion beam angle used to form the first grating 524 as operation 416 is aligned with the first depth gradient of the first grating 524.

In one or more embodiments, additional pluralities of fins can be formed during subsequent iterations of operation 416 after formation of the first grating 524. In this example, at operation 416, subsequent to forming the first grating, the first ion beam angle is changed to a second ion beam angle that is different from the first ion beam angle. Subsequent iterations of operation 416 include determining subsequent ion beam angles $\vartheta_x$ that may be different from the first ion beam angle $\vartheta_1$, for example, a second ion beam angle $\vartheta_2$ can be determined for the first grating 524. As discussed above, the second ion beam angle $\vartheta_2$ can be determined using the equation $\vartheta_2 = a\tan(\tan(\vartheta_2')/\cos(\varphi_2))$. A second portion of the substrate is positioned in a path of the ion beam when the ion beam is positioned at the second ion beam angle. The substrate is rotated about the central axis of the platen to a second rotation angle between the ion beam and a second grating vector of the second grating when the ion beam is at the second ion beam angle. Thus, multiple gratings can be formed on a single substrate at different slant angles and at different depth gradients by changing the ion beam angle and rotating the substrate at operation 416.

Figure 5J:
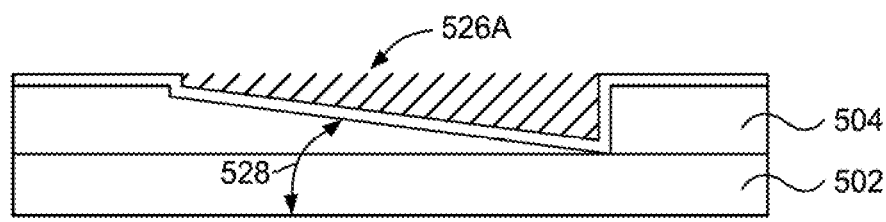

At operation 418, the second hardmask layer 520 is removed, for example, using a wet strip etch as discussed above with respect to operation 404. FIG. 5I shows a structure resulting from the removal of the second hardmask layer 520 at operation 418. In some embodiments of the method 400, at operation 420, a coating 526A is optionally formed on the plurality of fins 526 using an ALD process. In one or more examples, the coating 526A includes one or more layers of oxide. FIG. 5J shows a structure resulting from forming the coating on the plurality of fins 526 at operation 420. In examples where more than one grating is formed, some or all gratings can have coating disposed thereon at operation 420. In one or more examples, an ALD process can be used at operation 420 to coat the plurality of fins 526 with an oxide. In some examples, other methods of forming a conformal coating the plurality of fins 526 can be employed. In one or more examples, the plurality of fins 526 can coated at operation 420 to tune or refine critical dimensions of the plurality of fins 526.

Figure 6:
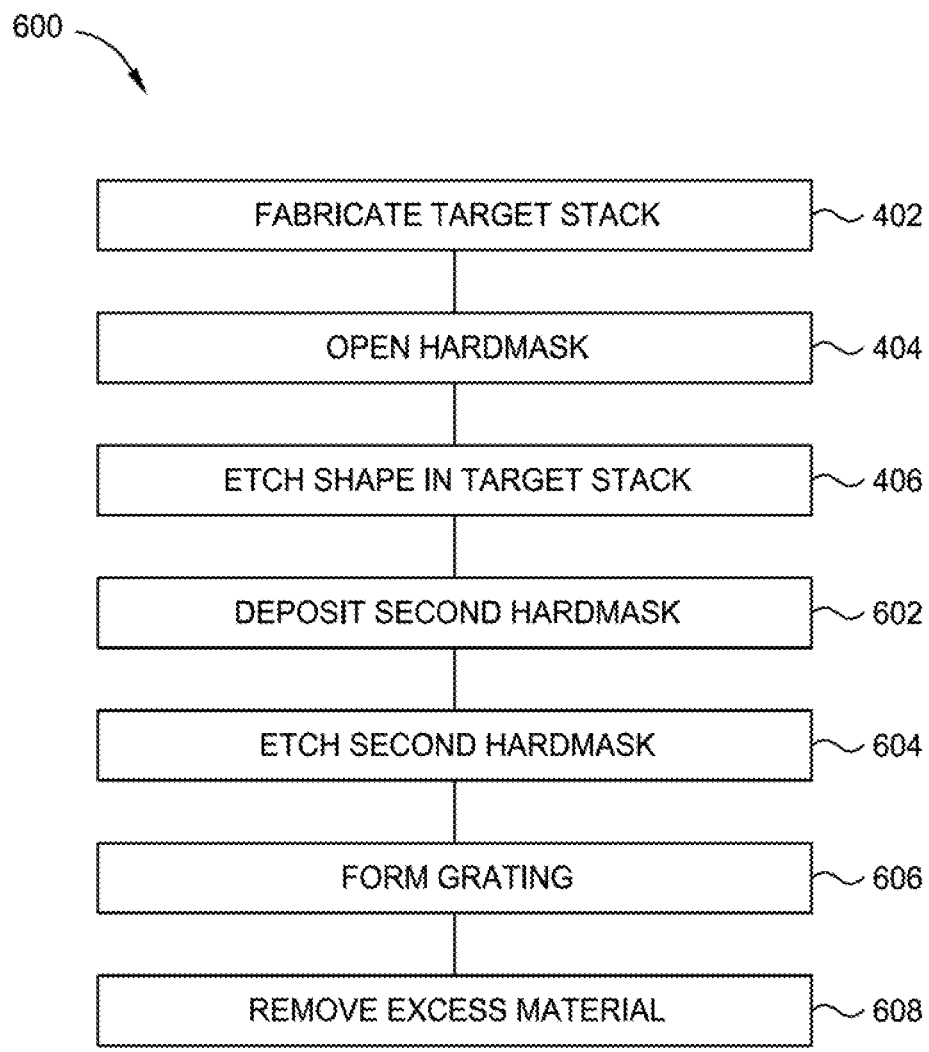
FIG. 6 is a flowchart illustrating another method for forming a grating, according to one or more embodiments described and discussed herein.
Figure 7A:
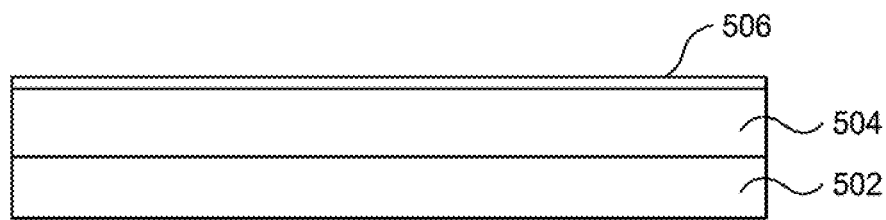
FIGS. 7A-7G illustrate structures at different of intervals while being produced during the method depicted in FIG. 6, according to one or more embodiments described and discussed herein.
Figure 7B:
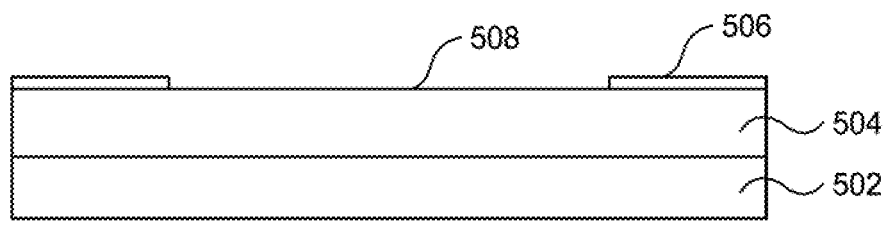
Figure 7C:
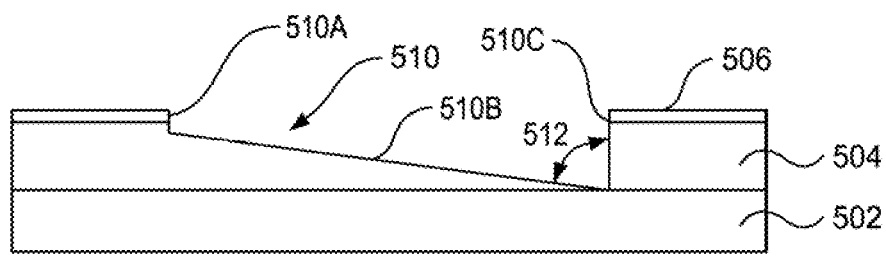
Figure 7D:
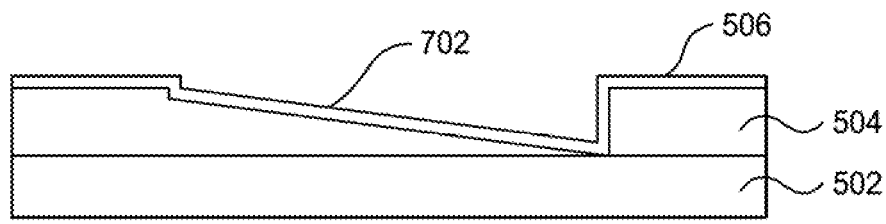

FIG. 6 is flowchart illustrating a method 600 of forming a grating, according to one or more embodiments described and discussed herein. FIGS. 7A-7G illustrate structures at different of intervals while being produced during the method 600. The method 600 includes operations 402, 404, and 406 that are discussed in detail above with respect to the method 400 in FIG. 4. FIG. 7A illustrates a structure formed by operation 402 that includes the substrate 502 and the grating material layer 504 and the hardmask layer 506. FIG. 7B illustrates a structure formed by operation 404, where an opening 508 is formed in the hardmask layer 506 using a wet strip (chemical) etch as discussed above in the method 400. FIG. 7C illustrates a structure formed by operation 406 after the removal of a portion of the first grating layer 504 to form the feature 510. Similar to what is shown in FIG. 5C, the feature 510 can be referred to as a recess or an angled recess and is defined by a first side 510A, a second side 510C opposite the first side 510A, and a transitional surface 510B extending between the first side 510A and the second side 510C. An angle 512 is formed between the transitional surface 510B and the second side 510C. However, in the method 600 of FIG. 6, in contrast to the method 400 where an etch stop layer and a second grating material layer are deposited subsequent to operation 406, a hardmask layer 702 is deposited at operation 602. The hardmask layer 702 can be deposited at operation 602 using CVD. FIG. 7D shows a structure resulting from the deposition of the hardmask layer 702 at operation 602. The hardmask layer 702 can be formed from similar materials as discussed above with respect to the hardmask layer 506 and the second hardmask layer 520.

Figure 7E:
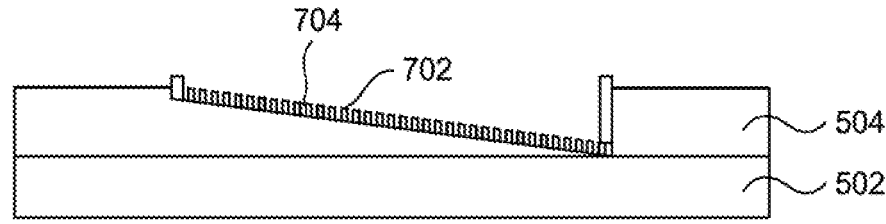

Subsequently, at operation 604, the hardmask layer 702, which can be referred to herein as the second hardmask layer, is etched to form a plurality of openings 704. FIG. 7E shows a structure resulting from the formation of openings in the hardmask layer 702 at operation 604. In some examples, during operation 604, the hardmask layer 702 is removed from portions 710 of the grating material layer 504 as well. The plurality of openings 704 can be formed in a plurality of sub operations including depositing a photoresist (not shown) on the hardmask layer 702, performing DUV lithography to pattern the photoresist, and etching the hardmask layer 702 through the patterned photoresist. The photoresist can then be removed prior to operation 606. In other examples, the plurality of openings 704 can be formed at operation 604 using NIL.

Figure 7F:
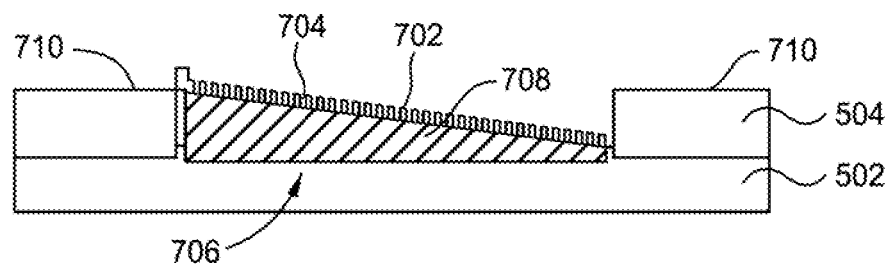
Figure 7G:
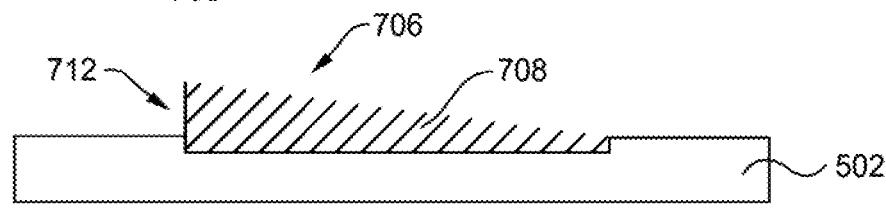

At operation 606, a grating 706 can be formed using angled etching to include a plurality of fins 708 formed at a slant angle and to a depth gradient and a wedge angle as discussed above. Operation 606 includes determining a first ion beam angle $\vartheta_1$ to use to form the grating 706. As discussed above, the first ion beam angle $\vartheta_1$ can be determined using the equation $\vartheta_1 = a\tan(\tan(\vartheta_1')/\cos(\varphi_1))$. FIG. 7F shows a structure resulting from the formation of the grating 706 at operation 606. The grating 706 formed at operation 606 can be formed in a similar manner to the one or more gratings discussed at operation 416 in FIG. 4 using an angled etch system by rotating the substrate 502 and changing the angle of the ion beam. For example, the grating 706 formed at operation 606 can be formed by angled etching by rotating the substrate 502 around a central axis perpendicular to the substrate and/or a platen on which the substrate is disposed. An ion beam, for example, a ribbon beam, is positioned at a predetermined angle relative to the substrate 502 and used to form the plurality of fins 708 to varying depths by modulating the duty cycle of the ion beam. Operation 606 can be repeated similarly to the iterations of operation 416 discussed above to form multiple gratings at varying slant angles, depth gradients, and wedge angles. Each ion beam angle $\vartheta_x$ can be determined for each grating subsequently formed at operation 606 as discussed above. At operation 608 of the method 600, one or more portions 710 of the grating material layer 504 are removed from the grating 706 using SAP etch to form a wedge 712. FIG. 7G shows the wedge 712 resulting from the formation of the plurality of fins 708 of the grating 706 subsequent to the removal of the portions 710 of the grating material layer 504 at operation 608. FIG. 7G further shows wedge 712 where the hardmask layer 702 is removed, which can occur at operation 608 or other operations not discussed herein.

Figure 8:
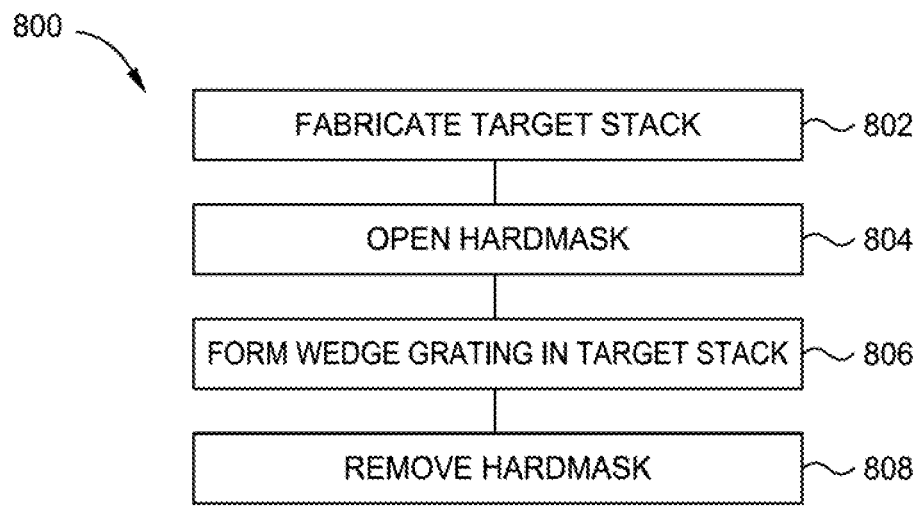
FIG. 8 is a flowchart illustrating another method for forming a grating, according to one or more embodiments described and discussed herein.
Figure 9A:
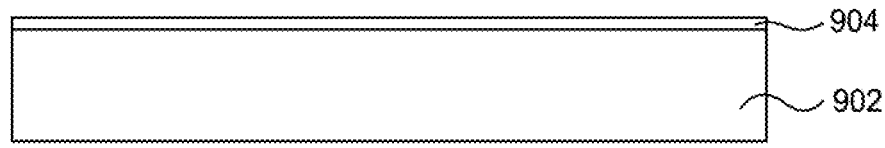
FIGS. 9A-9D illustrate structures at different of intervals while being produced during the method depicted in FIG. 8, according to one or more embodiments described and discussed herein.

FIG. 8 is flowchart illustrating a method 800 of forming a grating, according to one or more embodiments described and discussed herein. FIGS. 9A-9D illustrate structures at different of intervals while being produced during the method 800. At operation 802 in the method 800, a substrate including a grating material layer 902 is formed using, for example, CVD. FIG. 9A shows a structure resulting from formation of the grating material layer 902 at operation 802. In particular, FIG. 9A shows the grating material layer 902 that can be formed from an Si-based material to a thickness from about 200 nm to about 400 nm using CVD from at least one of silicon oxycarbide (SiOC), silicon oxide (e.g., silicon dioxide ($SiO_2$)), silicon nitride (SiN or $Si_3N_4$), or silicon carbonitride (SiCN). A hardmask layer 904 is formed over the grating material layer 902 and can be formed from a metallic or dielectric material as discussed above with respect to the methods 400 and 600.

Figure 9B:
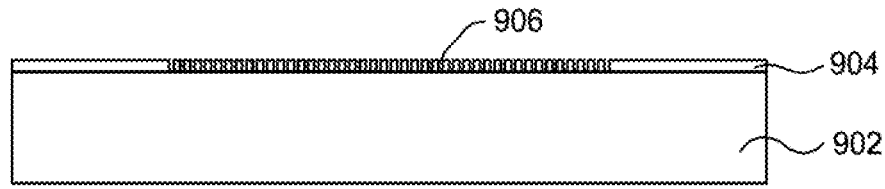
Figure 9C:
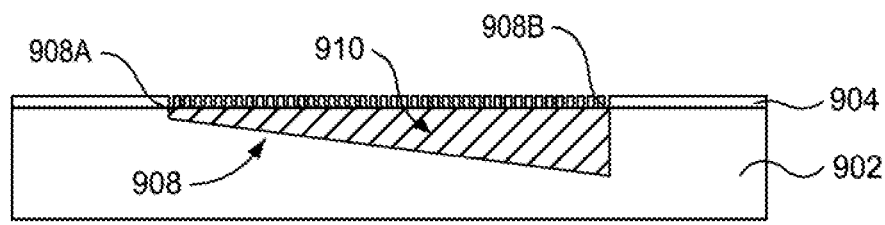

At operation 804, a plurality of openings 906 are formed in the hardmask layer 904. FIG. 9B shows a structure resulting from the formation of the hardmask layer 904 operation 804. The plurality of openings 906 can be formed at operation 804 in a plurality of sub operations including depositing a photoresist (not shown) on the hardmask layer 904, performing DUV lithography and etching or NIL to pattern the photoresist, etching the hardmask layer 904 through the patterned photoresist. The photoresist can then be removed prior to operation 806. FIG. 9C shows a structure resulting from the etching of the hardmask layer 904 at operation 804.

Figure 9D:
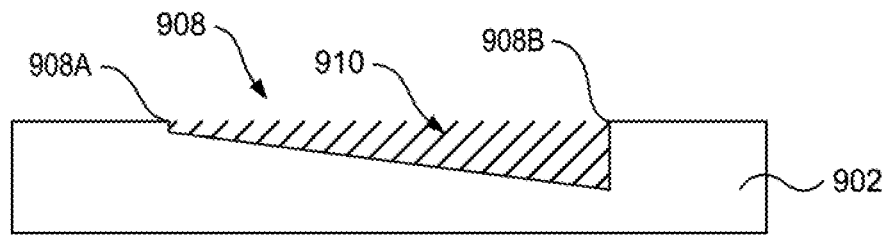

At operation 806, a grating 908 is formed in the grating material layer 902 from the Si-based material using an angled etch system as discussed herein. Operation 806 includes determining a first ion beam angle $\vartheta_1$ to use to form the grating 908. As discussed above, the first ion beam angle $\vartheta_1$ can be determined using equation $\vartheta_1 = a\tan(\tan(\vartheta_1')/\cos(\varphi_1))$. The grating 908 can be formed as a wedge-shaped grating, where a plurality of fins 910 of the grating 908 increase in size from a first end 908A of the grating 908 to a second end 908B of the grating 908. The grating 908 can be formed at operation 806 in a similar manner to the gratings for at operations 416 and 606 discussed above. A duty cycle of the ion beam that is configured with an adjustable angle is modulated to form each of the plurality of fins 910 to varying depths, and the substrate on which the grating material layer 902 is disposed can be rotated as well. In contrast to the method 400, no etch stop layer is used in the method 800. At operation 808, the hardmask layer 904 is removed, for example, using a chemical etch via wet strips. FIG. 9D shows a structure resulting from the removal of the hardmask layer 904 at operation 808.

Figure 10:
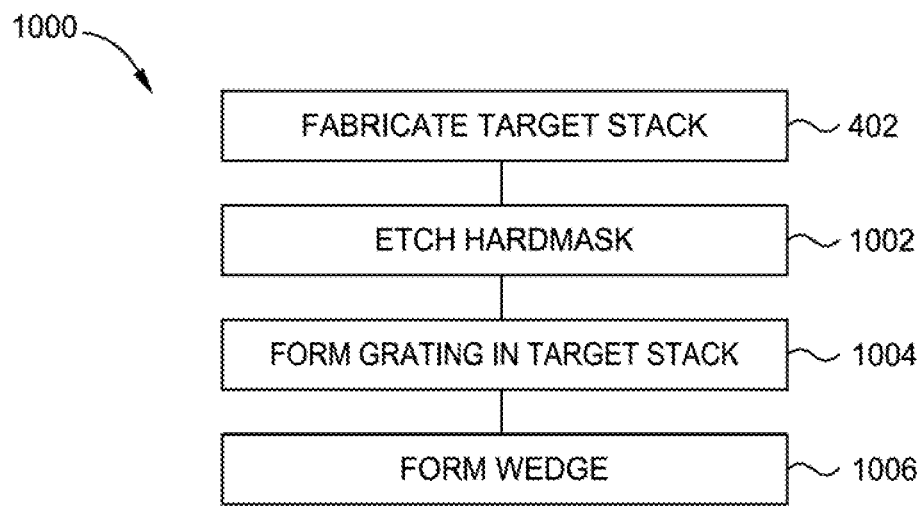
FIG. 10 is a flowchart illustrating another method for forming a grating, according to one or more embodiments described and discussed herein.
Figure 11A:
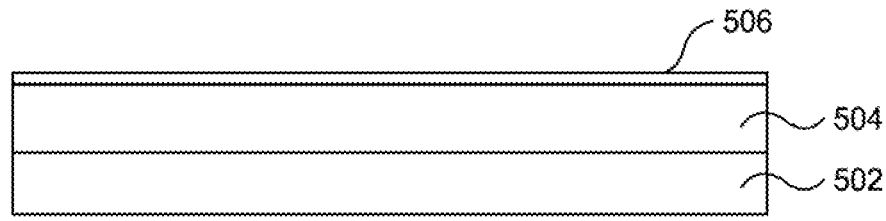
FIGS. 11A-11D illustrate structures at different of intervals while being produced during the method depicted in FIG. 10, according to one or more embodiments described and discussed herein.
Figure 11B:
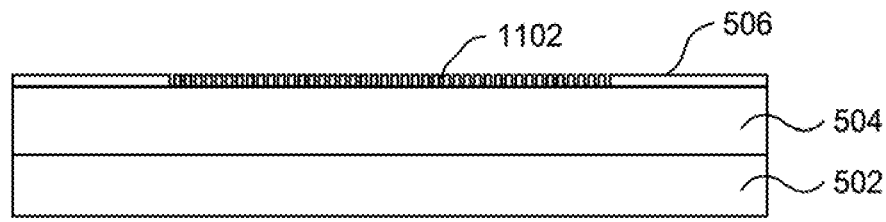
Figure 11C:
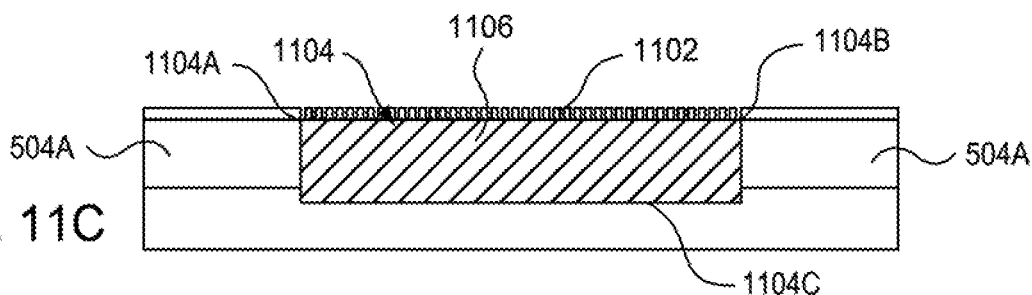
Figure 11D:
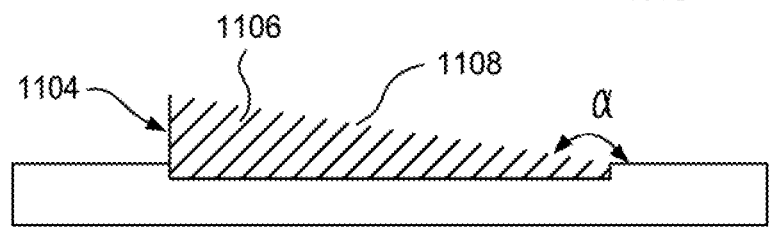

FIG. 10 is flowchart illustrating a method 1000 of forming a grating, according to one or more embodiments described and discussed herein. FIGS. 11A-11D illustrate structures at different of intervals while being produced during the method 1000. The method 1000 includes operation 402 that is executed in a similar fashion to operation 402 in the method 400 in FIG. 4. FIG. 11A shows a structure resulting from operation 402 in the method 1000. FIG. 11A shows a grating material layer 504 formed over a substrate 502, and a hardmask layer 506 formed over the grating material layer. At operation 1002, the hardmask layer 506 is opened to form a plurality of openings 1101 in a similar manner to operations 404 and 804 discussed above using DUV lithography and etching or NIL. FIG. 11B shows a structure resulting from the opening of the hardmask layer 506 at operation 1002 in the method 1000. This is in contrast to operation 404 in the method 400 where a contiguous portion of the hardmask layer is removed. Subsequently, at operation 1004 of the method 1000, a grating 1104 is formed in the grating material layer 504 using angled etching by rotating the substrate 502 and modulating the duty cycle of an ion beam as discussed above. Operation 1004 includes determining a first ion beam angle $\vartheta_1$ to use to form the grating 1104. As discussed above, the first ion beam angle $\vartheta_1$ can be determined using the equation $\vartheta_1 = a\tan(\tan(\vartheta_1')/\cos(\varphi_1))$. FIG. 11C shows a structure resulting from the formation of the grating 1104 operation 1004 in the method 1000. The grating 1104 is formed to have a plurality of fins 110B, a first end 1104A, a second end 1104B, and a bottom 1104C, and is formed to have a rectangular shape such that the first end 1104A and the second end 1104B are at a substantially right angle to the bottom 1104C. At operation 1006, a portion of the fins 110B is removed using SAP to form a top surface 1108 of the grating 1104 such that the grating 1104 has a cross section of a wedge. This is in contrast to the rectangular shape formed at operation 1004. Further in operation 1006, portions 504A (shown in FIG. 11C) of the grating material layer 504 are removed, as is the hardmask layer 1102. FIG. 11D shows a structure resulting from the etching of the grating 1104 at operation 1006 in the method 1000. The portion of the fins 110B removed at operation 1006 are removed at a wedge angle α measured relative to the substrate 502. Operations 1002, 1004, and 1006 can be repeated to form additional gratings in the grating material layer 504 at other slant angles, using different ion beam angles, different substrate rotation angles, and duty cycle modulation as discussed herein.

Embodiments of the present disclosure further relate to any one or more of the following paragraphs 1-29:

1. A method of forming a grating, comprising: etching a hardmask layer to form a plurality of openings, the hardmask layer being disposed over a grating material layer that is disposed on a substrate; forming a first grating in the grating material layer through the plurality of openings of the hardmask layer, wherein the first grating has a first shape vector and a first grating vector, wherein forming the first grating comprises: determining a first ion beam angle $\vartheta_1$ according to a formula $\vartheta_1 = a\tan(\tan(\vartheta_1')/\cos(\varphi_1))$, wherein $\vartheta_1'$ is a first slant angle and $\varphi_1$ is an angle between the first shape vector and the first grating vector; positioning a first portion of the grating material layer in a path of an ion beam at the first ion beam angle $\vartheta_1$ relative to the substrate, the substrate being retained on a platen; rotating the substrate about a central axis of the platen to a first rotation angle between the ion beam and the first grating vector of the first grating; and modulating a process parameter when the ion beam is at the first ion beam angle $\vartheta_1$ to form a first plurality of fins of the first grating having the first shape vector, the first grating vector, and the first slant angle $\vartheta_1'$ relative to a surface normal of the substrate such that the first plurality of fins are formed at the first slant angle $\vartheta_1'$.

2. A method of forming a grating, comprising: etching a first grating material layer to form a first feature in the first grating material layer disposed on a substrate; depositing an etch stop layer in the first feature; depositing a second grating material layer on the etch stop layer; depositing a hardmask layer on the second grating material layer; etching the hardmask layer to form a plurality of openings; and forming a first grating in the second grating material layer through the plurality of openings, wherein the first grating has a first shape vector and a first grating vector, wherein forming the first grating comprises: determining a first ion beam angle $\vartheta_1$ according to a formula $\vartheta_1 = a\tan(\tan(\vartheta_1')/\cos(\varphi_1))$, wherein $\vartheta_1'$ is a first slant angle and $\varphi_1$ is an angle between the first shape vector and the first grating vector; positioning a first portion of the substrate relative to an ion beam at the first ion beam angle $\vartheta_1$, the substrate being retained on a platen and the first ion beam angle $\vartheta_1$ being measured relative to a plane parallel to the platen; rotating the substrate about a central axis of the platen to a first rotation angle between the ion beam and a first grating vector of the first grating when the ion beam is at the first ion beam angle $\vartheta_1$; and modulating a process parameter when the ion beam is at the first ion beam angle $\vartheta_1$ and in contact with the first portion of the substrate.

3. A method of forming a grating, comprising: etching a plurality of openings in a hardmask layer, the hardmask layer being disposed on a grating material layer and the grating material layer being disposed on a substrate, etching, through the plurality of openings in the hardmask layer, the substrate, to form a first grating in the grating material layer, the first grating comprising a plurality of fins formed in a recess, wherein the first grating is has a first shape vector and a first grating vector, wherein forming the first grating comprises: determining a first ion beam angle $\vartheta_1$ according to a formula $\vartheta_1 = a\tan(\tan(\vartheta_1')/\cos(\varphi_1))$, wherein $\vartheta_1'$ is a first slant angle and $\varphi_1$ is an angle between the first shape vector and the first grating vector; positioning a first portion of the grating material layer relative to an ion beam at the first ion beam angle $\vartheta_1$, the ion beam being adjustable within an angle of about 15° to about 75° relative to a plane parallel to the substrate, the substrate being retained on a platen; and rotating the substrate about a central axis of the platen to a first rotation angle between the ion beam and the first grating vector of the first grating when the ion beam is at the first ion beam angle $\vartheta_1$; and etching the first grating at a first angle to remove a top portion of the plurality of fins to form a wedge, wherein the first shape vector is a wedge vector.

4. A method of forming a grating, comprising: etching a hardmask layer to form a plurality of openings, the hardmask layer being disposed over a grating material layer that is disposed on a substrate; forming a first grating in the grating material layer through the plurality of openings of the hardmask layer, wherein the first grating has a first shape vector and a first grating vector, wherein forming the first grating comprises: determining a first ion beam angle $\vartheta_1$ relative to a first slant angle $\vartheta_1'$ and an angle $\varphi_1$ which is between the first shape vector and the first grating vector; positioning a first portion of the grating material layer in a path of an ion beam at the first ion beam angle $\vartheta_1$ relative to the substrate, the substrate being retained on a platen; and modulating a process parameter when the ion beam is at the first ion beam angle $\vartheta_1$ to form a first plurality of fins of the first grating having the first shape vector, the first grating vector, and the first slant angle $\vartheta_1'$ relative to a surface normal of the substrate such that the first plurality of fins are formed at the first slant angle $\vartheta_1'$.

5. A method of forming a grating, comprising: etching a first grating material layer to form a first feature in the first grating material layer disposed on a substrate; depositing an etch stop layer in the first feature; depositing a second grating material layer on the etch stop layer; depositing a hardmask layer on the second grating material layer; etching the hardmask layer to form a plurality of openings; and forming a first grating in the second grating material layer through the plurality of openings, wherein the first grating has a first shape vector and a first grating vector, wherein forming the first grating comprises: determining a first ion beam angle $\vartheta_1$ relative to a first slant angle $\vartheta_1'$ and an angle $\varphi_1$ which is between the first shape vector and the first grating vector; positioning a first portion of the substrate relative to an ion beam at the first ion beam angle $\vartheta_1$, the substrate being retained on a platen and the first ion beam angle $\vartheta_1$ being measured relative to a plane parallel to the platen; and modulating a process parameter when the ion beam is at the first ion beam angle $\vartheta_1$ and in contact with the first portion of the substrate.

6. A method of forming a grating, comprising: etching a plurality of openings in a hardmask layer, the hardmask layer being disposed on a grating material layer and the grating material layer being disposed on a substrate, etching, through the plurality of openings in the hardmask layer, the substrate, to form a first grating in the grating material layer, the first grating comprising a plurality of fins formed in a recess, wherein the first grating is has a first shape vector and a first grating vector, wherein forming the first grating comprises: determining a first ion beam angle $\vartheta_1$ relative to a first slant angle $\vartheta_1'$ and an angle $\varphi_1$ which is between the first shape vector and the first grating vector; positioning a first portion of the grating material layer relative to an ion beam at the first ion beam angle $\vartheta_1$, the ion beam being adjustable within an angle of about 15° to about 75° relative to a plane parallel to the substrate, the substrate being retained on a platen; and rotating the substrate about a central axis of the platen to a first rotation angle between the ion beam and the first grating vector of the first grating when the ion beam is at the first ion beam angle $\vartheta_1$; and etching the first grating at a first angle to remove a top portion of the plurality of fins to form a wedge, wherein the first shape vector is a wedge vector.

7. The method according to any one of paragraphs 1-6, wherein the first ion beam angle $\vartheta_1$ is determined according to a formula $\vartheta_1 = a\,\tan(\tan(\vartheta_1')/\cos(\varphi_1))$.

8. The method according to any one of paragraphs 1-7, further comprising rotating the substrate about a central axis of the platen to a first rotation angle between the ion beam and the first grating vector of the first grating.

9. The method according to any one of paragraphs 1-8, further comprising: forming a second grating in the grating material layer, the second grating comprising a second plurality of fins having a second shape vector and a second grating vector, wherein forming the second grating comprises: determining a second ion beam angle $\vartheta_2$ relative to a second slant angle $\vartheta2'$ and an angle $\varphi_2$ which is between the second shape vector and the second grating vector; positioning a second portion of the grating material layer in a second path of the ion beam at a second ion beam angle $\vartheta_2$ to form a second grating in the grating material layer; rotating the substrate about the central axis of the platen resulting in a second rotation angle between the ion beam and the second grating vector of the second grating; and modulating the process parameter when the ion beam is at the second ion beam angle $\vartheta_2$ to form the second plurality of fins, the second plurality of fins being formed at the second slant angle $\vartheta_2'$ and having the second shape vector and the second grating vector.

10. The method according to any one of paragraphs 1-9, wherein the second rotation angle is different from the first rotation angle, and wherein the second ion beam angle $\vartheta_2$ is determined according to a formula $\vartheta_2 = a\,\tan(\tan(\vartheta_2')/\cos(\varphi_2))$.

11. The method according to any one of paragraphs 1-10, wherein the ion beam is a ribbon beam.

12. The method according to any one of paragraphs 1-11, wherein the first ion beam angle $\vartheta_1$ is from about 15° to about 75° relative to a plane perpendicular to the substrate.

13. The method according to any one of paragraphs 1-12, further comprising: forming a second grating in the grating material layer, the second grating comprising a second plurality of fins having a second shape vector and a second grating vector, wherein forming the second grating comprises: determining a second ion beam angle $\vartheta_2$ according to a formula $\vartheta_2 = a\,\tan(\tan(\vartheta_2')/\cos(\varphi_2))$, wherein $\vartheta_2'$ is a second slant angle and $\varphi_2$ is an angle between the second shape vector and the second grating vector; positioning a second portion of the grating material layer in a second path of the ion beam at a second ion beam angle $\vartheta_2$ to form a second grating in the grating material layer; rotating the substrate about the central axis of the platen resulting in a second rotation angle between the ion beam and the second grating vector of the second grating; and modulating the process parameter when the ion beam is at the second ion beam angle $\vartheta_2$ to form the second plurality of fins, the second plurality of fins being formed at the second slant angle $\vartheta_2'$ and having the second shape vector and the second grating vector.

14. The method according to any one of paragraphs 1-13, wherein the second rotation angle is different from the first rotation angle.

15. The method according to any one of paragraphs 1-14, wherein the process parameter comprises a duty cycle of the ion beam, a partial scan of the ion beam, a scan speed of the ion beam, a power source for generating the ion beam, or any combination thereof.

16. The method according to any one of paragraphs 1-15, further comprising, subsequent to forming the first grating, removing the hardmask layer 17. The method according to any one of paragraphs 1-16, wherein the grating material layer comprises one or more of silicon oxycarbide, silicon oxide, silicon carbonitride, silicon nitride, or any combination thereof.

18. The method according to any one of paragraphs 1-17, wherein each of the first grating material layer and the second grating material layer comprises one or more of silicon oxycarbide, titanium dioxide, silicon oxide, vanadium oxide, aluminum oxide, indium tin oxide, zinc oxide, tantalum pentoxide, silicon nitride, titanium nitride, or zirconium dioxide.

19. The method according to any one of paragraphs 1-18, wherein the hardmask layer comprises silicon oxide, silicon nitride, or a combination thereof.

20. The method according to any one of paragraphs 1-19, wherein the first feature comprises a recess and is defined by a first side formed to a first depth in the first grating material layer, a second side defined by a second depth in the first grating material layer, and a third side extending between the first side and the second side, the first depth being less than the second depth.

21. The method according to any one of paragraphs 1-20, wherein the first grating comprises a plurality of fins that has a first slant angle $\vartheta_1'$ relative to a surface normal of the substrate.

22. The method according to any one of paragraphs 1-21, wherein the first plurality of fins decrease in height according to a first depth gradient from the first side of the recess to the second side of the recess.

23. The method according to any one of paragraphs 1-22, wherein the first ion beam angle $\vartheta_1$ is aligned with the first depth gradient of the first grating.

24. The method according to any one of paragraphs 1-23, further comprising: removing the hardmask layer; and coating the first plurality of fins with an oxide layer.

25. The method according to any one of paragraphs 1-24, further comprising: subsequent to forming the first grating, changing the first ion beam angle $\vartheta_1$ to a second ion beam angle $\vartheta_2$ that is different from the first ion beam angle $\vartheta_1$; and forming a second grating in the second grating material layer, the second grating comprising a second plurality of fins having a second shape vector and a second grating vector, wherein forming the second grating comprises: determining a second ion beam angle $\vartheta_2$ according to a formula $\vartheta_2 = a\tan(\tan(\vartheta_2')/\cos(\varphi_2))$, wherein $\vartheta_2'$ is a second slant angle and $\varphi_2$ is an angle between the second shape vector and the second grating vector; positioning a second portion of the substrate in a path of the ion beam at the second ion beam angle $\vartheta_2$; and rotating the substrate about the central axis of the platen to a second rotation angle between the ion beam and a second grating vector of the second grating when the ion beam is at the second ion beam angle $\vartheta_2$, wherein the ion beam contacts the second grating material layer at the second ion beam angle $\vartheta_2$ to form the second plurality of fins having the second slant angle $\vartheta_2'$, the second shape vector, and the second grating vector.

26. The method according to any one of paragraphs 1-25, further comprising, subsequent to depositing the second grating material layer, prior to forming the first grating in the second grating material layer, planarizing the substrate in which the first grating is formed to remove a portion of the second grating material layer.

27. The method according to any one of paragraphs 1-26, further comprising forming a conformal oxide coating on the plurality of fins.

28. The method according to any one of paragraphs 1-27, further comprising: forming a second grating in the grating material layer, the second grating comprising a second plurality of fins, a second shape vector, and a second grating vector, wherein forming the second grating comprises: determining a second ion beam angle $\vartheta_2$ according to a formula $\vartheta_2 = a\tan(\tan(\vartheta_2')/\cos(\varphi_2))$, wherein $\vartheta_2'$ is a second slant angle and $\varphi_2$ is an angle between the second shape vector and the second grating vector; positioning a second portion of the substrate in a path of the ion beam at a second ion beam angle $\vartheta_2$ to form a second grating in the grating material layer; rotating the substrate about the central axis of the platen resulting in a second rotation angle between the ion beam and a second grating vector of the second grating; and modulating a process parameter when the ion beam is at the second ion beam angle $\vartheta_2$ to form a second plurality of fins, the second plurality of fins having a second slant angle $\vartheta_2'$ relative to a surface normal of the substrate and having the second shape vector and the second grating vector, wherein the process parameter comprises a duty cycle of the ion beam, a partial scan of the ion beam, a scan speed of the ion beam, a power source for generating the ion beam, or any combination thereof.

29. An apparatus or a system for performing the method according to any one of paragraphs 1-28.

Thus, using the systems and methods discussed herein, multiple gratings for augmented waveguide combiners and/or masters for imprinting grating materials can be fabricated. Gratings of varying depth gradients and slant angles can be formed on a single substrate using embodiments discussed herein by at least changing the ion beam angle and modulating the duty cycle of the ion beam in combination with rotating the substrate relative to the ion beam angle.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise whenever a composition, an element or a group of elements is preceded with the transitional phrase "comprising", it is understood that we also contemplate the same composition or group of elements with transitional phrases "consisting essentially of," "consisting of", "selected from the group of consisting of," or "is" preceding the recitation of the composition, element, or elements and vice versa.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

The invention claimed is:

1. A method of forming a grating, comprising:
etching a hardmask layer to form a plurality of openings, the hardmask layer being disposed over a grating material layer that is disposed on a substrate;
forming a first grating in the grating material layer through the plurality of openings of the hardmask layer, wherein the first grating has a first shape vector and a first grating vector, wherein forming the first grating comprises:
determining a first ion beam angle $\vartheta_1$ relative to a first slant angle $\vartheta_1'$ and an angle $\varphi_1$ which is between the first shape vector and the first grating vector;
positioning a first portion of the grating material layer in a path of an ion beam at the first ion beam angle $\vartheta_1$ relative to the substrate, the substrate being retained on a platen; and
modulating a process parameter when the ion beam is at the first ion beam angle $\vartheta_1$ to form a first plurality of fins of the first grating having the first shape vector, the first grating vector, and the first slant angle $\vartheta_1'$ relative to a surface normal of the substrate such that the first plurality of fins are formed at the first slant angle $\vartheta_1'$.

2. The method of claim 1, wherein the ion beam is a ribbon beam and the first ion beam angle $\vartheta_1$ is from about 15° to about 75° relative to a plane perpendicular to the substrate.

3. The method of claim 1, wherein the first ion beam angle $\vartheta_1$ is determined according to a formula $\vartheta_1 = a\tan(\tan(\vartheta_1')/\cos(\varphi_1))$.

4. The method of claim 1, further comprising rotating the substrate about a central axis of the platen to a first rotation angle between the ion beam and the first grating vector of the first grating.

5. The method of claim 4, further comprising:
forming a second grating in the grating material layer, the second grating comprising a second plurality of fins having a second shape vector and a second grating vector, wherein forming the second grating comprises:
determining a second ion beam angle $\vartheta_2$ relative to a second slant angle $\vartheta_2'$ and an angle $\vartheta_2$ which is between the second shape vector and the second grating vector;
positioning a second portion of the grating material layer in a second path of the ion beam at a second ion beam angle $\vartheta_2$ to form a second grating in the grating material layer;
rotating the substrate about the central axis of the platen resulting in a second rotation angle between the ion beam and the second grating vector of the second grating; and
modulating the process parameter when the ion beam is at the second ion beam angle $\vartheta_2$ to form the second plurality of fins, the second plurality of fins being formed at the second slant angle $\vartheta_2'$ and having the second shape vector and the second grating vector.

6. The method of claim 5, wherein the second rotation angle is different from the first rotation angle, and wherein the second ion beam angle $\vartheta_2$ is determined according to a formula $\vartheta_2 = a\tan(\tan(\vartheta_2')/\cos(\varphi_2))$.

7. The method of claim 1, wherein the process parameter comprises a duty cycle of the ion beam, a partial scan of the ion beam, a scan speed of the ion beam, a power source for generating the ion beam, or any combination thereof.

8. The method of claim 1, further comprising, subsequent to forming the first grating, removing the hardmask layer, and wherein the grating material layer comprises one or more of silicon oxycarbide, silicon oxide, silicon carbonitride, silicon nitride, or any combination thereof.

9. A method of forming a grating, comprising:
etching a first grating material layer to form a first feature in the first grating material layer disposed on a substrate;
depositing an etch stop layer in the first feature;
depositing a second grating material layer on the etch stop layer;
depositing a hardmask layer on the second grating material layer;
etching the hardmask layer to form a plurality of openings; and
forming a first grating in the second grating material layer through the plurality of openings, wherein the first grating has a first shape vector and a first grating vector, wherein forming the first grating comprises:
determining a first ion beam angle $\vartheta_1$ relative to a first slant angle $\vartheta_1'$ and an angle $\varphi_1$ which is between the first shape vector and the first grating vector;
positioning a first portion of the substrate relative to an ion beam at the first ion beam angle $\vartheta_1$, the substrate being retained on a platen and the first ion beam angle $\vartheta_1$ being measured relative to a plane parallel to the platen; and
modulating a process parameter when the ion beam is at the first ion beam angle $\vartheta_1$ and in contact with the first portion of the substrate.

10. The method of claim 9, wherein the process parameter comprises a duty cycle of the ion beam, a partial scan of the ion beam, a scan speed of the ion beam, a power source for generating the ion beam, or any combination thereof.

11. The method of claim 9, wherein each of the first grating material layer and the second grating material layer comprises one or more of silicon oxycarbide, titanium dioxide, silicon oxide, vanadium oxide, aluminum oxide, indium tin oxide, zinc oxide, tantalum pentoxide, silicon nitride, titanium nitride, or zirconium dioxide, and wherein the hardmask layer comprises silicon oxide, silicon nitride, or a combination thereof.

12. The method of claim 11, wherein the first feature comprises a recess and is defined by a first side formed to a first depth in the first grating material layer, a second side defined by a second depth in the first grating material layer, and a third side extending between the first side and the second side, the first depth being less than the second depth.

13. The method of claim 12, wherein the first grating comprises a plurality of fins that has a first slant angle $\vartheta_1'$ relative to a surface normal of the substrate, wherein the first plurality of fins decrease in height according to a first depth gradient from the first side of the recess to the second side of the recess, and wherein the first ion beam angle $\vartheta_1$ is aligned with the first depth gradient of the first grating.

14. The method of claim 13, further comprising:
removing the hardmask layer; and
coating the first plurality of fins with an oxide layer.

15. The method of claim 11, further comprising rotating the substrate about a central axis of the platen to a first rotation angle between the ion beam and a first grating vector of the first grating when the ion beam is at the first ion beam angle $\vartheta_1$.

16. The method of claim 15, further comprising:
subsequent to forming the first grating, changing the first ion beam angle $\vartheta_1$ to a second ion beam angle $\vartheta_2$ that is different from the first ion beam angle $\vartheta_1$; and forming a second grating in the second grating material layer, the second grating comprising a second plurality of fins having a second shape vector and a second grating vector, wherein forming the second grating comprises:
  determining a second ion beam angle $\vartheta_2$ relative to a second slant angle $\vartheta_2'$ and an angle $\varphi_2$ which is between the second shape vector and the second grating vector;
  positioning a second portion of the substrate in a path of the ion beam at the second ion beam angle $\vartheta_2$; and
  rotating the substrate about the central axis of the platen to a second rotation angle between the ion beam and a second grating vector of the second grating when the ion beam is at the second ion beam angle $\vartheta_2$, wherein the ion beam contacts the second grating material layer at the second ion beam angle $\vartheta_2$ to form the second plurality of fins having the second slant angle $\vartheta_2'$, the second shape vector, and the second grating vector.

17. The method of claim 11, further comprising, subsequent to depositing the second grating material layer, prior to forming the first grating in the second grating material layer, planarizing the substrate in which the first grating is formed to remove a portion of the second grating material layer.

18. A method of forming a grating, comprising:
  etching a plurality of openings in a hardmask layer, the hardmask layer being disposed on a grating material layer and the grating material layer being disposed on a substrate,
  etching, through the plurality of openings in the hardmask layer, the substrate, to form a first grating in the grating material layer, the first grating comprising a plurality of fins formed in a recess, wherein the first grating is has a first shape vector and a first grating vector, wherein forming the first grating comprises:
    determining a first ion beam angle $\vartheta_1$ relative to a first slant angle $\vartheta_1'$ and an angle $\varphi_1$ which is between the first shape vector and the first grating vector;
    positioning a first portion of the grating material layer relative to an ion beam at the first ion beam angle $\vartheta_1$, the ion beam being adjustable within an angle of about 15° to about 75° relative to a plane parallel to the substrate, the substrate being retained on a platen; and
    rotating the substrate about a central axis of the platen to a first rotation angle between the ion beam and the first grating vector of the first grating when the ion beam is at the first ion beam angle $\vartheta_1$; and
  etching the first grating at a first angle to remove a top portion of the plurality of fins to form a wedge, wherein the first shape vector is a wedge vector.

19. The method of claim 18, wherein the recess is defined by a first side formed to a first depth in the substrate, a second side defined by a second depth in the substrate, and a third side extending between the first side and the second side, the first depth being the same as the second depth.

20. The method of claim 18, further comprising:
  forming a second grating in the grating material layer, the second grating comprising a second plurality of fins, a second shape vector, and a second grating vector, wherein forming the second grating comprises:
    determining a second ion beam angle $\vartheta_2$ relative to a second slant angle $\vartheta_2'$ and an angle $\varphi_2$ which is between the second shape vector and the second grating vector;
    positioning a second portion of the substrate in a path of the ion beam at a second ion beam angle $\vartheta_2$ to form a second grating in the grating material layer;
    rotating the substrate about the central axis of the platen resulting in a second rotation angle between the ion beam and a second grating vector of the second grating; and
    modulating a process parameter when the ion beam is at the second ion beam angle $\vartheta_2$ to form a second plurality of fins, the second plurality of fins having a second slant angle $\vartheta_2'$ relative to a surface normal of the substrate and having the second shape vector and the second grating vector, wherein the process parameter comprises a duty cycle of the ion beam, a partial scan of the ion beam, a scan speed of the ion beam, a power source for generating the ion beam, or any combination thereof.

* * * * *

UNITED STATES PATENT AND TRADEMARK OFFICE
CERTIFICATE OF CORRECTION

PATENT NO. : 11,380,578 B2
APPLICATION NO. : 16/656798
DATED : July 5, 2022
INVENTOR(S) : Rutger Meyer Timmerman Thijssen et al.

It is certified that error appears in the above-identified patent and that said Letters Patent is hereby corrected as shown below:

In the Specification

In Column 5, Line 30, delete "1166." and insert -- 116B. --.

In Column 5, Line 33, delete "1206." and insert -- 120B. --.

In Column 5, Line 36, delete "1166" and insert -- 116B --.

In Column 5, Line 38, delete "1166" and insert -- 116B --.

In Column 5, Line 40, delete "1206" and insert -- 120B --.

In Column 8, Line 7, delete "$\vartheta$=atan(tan(22.5°/cos" and insert -- $\vartheta$=atan(tan(22.5°)/cos --.

In Column 10, Line 15, delete "$\vartheta_1$=a tan(tan($\vartheta_1'$)/cos($\varphi_1$))." and insert -- $\vartheta_1$=atan(tan($\vartheta_1'$)/cos($\varphi_1$)). --.

In Column 10, Line 66, delete "$\vartheta_2$=a tan(tan($\vartheta_2'$)/cos($\varphi_2$))." and insert -- $\vartheta_2$=atan(tan($\vartheta_2'$)/cos($\varphi_2$)). --.

In Column 12, Line 13, delete "$\vartheta_1$=a tan(tan($\vartheta_1'$)/cos($\varphi_1$))." and insert -- $\vartheta_1$=atan(tan($\vartheta_1'$)/cos($\varphi_1$)). --.

In Column 13, Line 9, delete "$\vartheta_1$=a tan(tan($\vartheta_1'$)/cos" and insert -- $\vartheta_1$=atan(tan($\vartheta_1'$)/cos --.

In Column 13, Line 49, delete "$\vartheta_1$=a tan(tan($\vartheta_1'$)/cos($\varphi_1$))." and insert -- $\vartheta_1$=atan(tan($\vartheta_1'$)/cos($\varphi_1$)). --.

In Column 13, Line 52, delete "110B," and insert -- 1106, --.

In Column 13, Line 57, delete "110B" and insert -- 1106 --.

In Column 13, Line 65, delete "110B" and insert -- 1106 --.

Signed and Sealed this
Twenty-fifth Day of June, 2024

Katherine Kelly Vidal
*Director of the United States Patent and Trademark Office*

CERTIFICATE OF CORRECTION (continued)
U.S. Pat. No. 11,380,578 B2

In Column 14, Line 15, delete "$\vartheta_1 = a\ \tan(\tan(\vartheta_1')/\cos(\varphi_1))$," and insert -- $\vartheta_1 = \operatorname{atan}(\tan(\vartheta_1')/\cos(\varphi_1))$, --.

In Column 14, Line 40, delete "$\vartheta_1 = a\ \tan(\tan(\vartheta_1')/\cos$" and insert -- $\vartheta_1 = \operatorname{atan}(\tan(\vartheta_1')/\cos$ --.

In Column 14, Line 63, delete "$\vartheta_1 = a\ \tan(\tan(\vartheta_1')/\cos(\varphi_1))$," and insert -- $\vartheta_1 = \operatorname{atan}(\tan(\vartheta_1')/\cos(\varphi_1))$, --.

In Column 16, Line 6, delete "$\vartheta_1 = a\ \tan(\tan(\vartheta_1')/\cos(\varphi_1))$." and insert -- $\vartheta_1 = \operatorname{atan}(\tan(\vartheta_1')/\cos(\varphi_1))$. --.

In Column 16, Line 33, delete "$\vartheta_2 = a\ \tan(\tan(\vartheta_2')/\cos$" and insert -- $\vartheta_2 = \operatorname{atan}(\tan(\vartheta_2')/\cos$ --.

In Column 16, Line 46, delete "$\vartheta_2 = a\ \tan(\tan(\vartheta_2')/\cos(\varphi_2))$," and insert -- $\vartheta_2 = \operatorname{atan}(\tan(\vartheta_2')/\cos(\varphi_2))$, --.

In Column 17, Line 50, delete "$\vartheta_2 = a\ \tan(\tan(\vartheta_2')/\cos(\varphi_2))$," and insert -- $\vartheta_2 = \operatorname{atan}(\tan(\vartheta_2')/\cos(\varphi_2))$, --.

In Column 18, Line 10, delete "$\vartheta_2 = a\ \tan(\tan(\vartheta_2')/\cos(\varphi_2))$," and insert -- $\vartheta_2 = \operatorname{atan}(\tan(\vartheta_2')/\cos(\varphi_2))$, --.

In the Claims

In Column 19, Line 42, in Claim 5, delete "$\vartheta_2$" and insert -- $\varphi_2$ --.

In Column 19, Line 61, in Claim 6, delete "$\vartheta_2 = a\ \tan(\tan(\vartheta_2')/\cos(\varphi_2))$." and insert -- $\vartheta_2 = \operatorname{atan}(\tan(\vartheta_2')/\cos(\varphi_2))$. --.